(12) United States Patent
Tetsuo et al.

(10) Patent No.: US 9,568,156 B2
(45) Date of Patent: Feb. 14, 2017

(54) LIGHT SOURCE MODULE AND LIGHTING DEVICE HAVING THE SAME

(71) Applicant: Samsung Electronics Co., Ltd., Suwon-Si, Gyeonggi-Do (KR)

(72) Inventors: Ariyoshi Tetsuo, Suwon-si (KR); Cheon Ho Park, Suwon-si (KR); Jong Pil Won, Yongin-si (KR); Ji Hoon Yun, Seoul (KR); Jun Ho Jung, Suwon-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 231 days.

(21) Appl. No.: 14/133,822

(22) Filed: Dec. 19, 2013

(65) Prior Publication Data

US 2014/0218909 A1 Aug. 7, 2014

(30) Foreign Application Priority Data

Feb. 1, 2013 (KR) .......................... 10-2013-0012004

(51) Int. Cl.
*F21V 5/04* (2006.01)
*F21V 5/02* (2006.01)
(Continued)

(52) U.S. Cl.
CPC . *F21K 9/64* (2016.08); *F21K 9/65* (2016.08); *F21V 5/02* (2013.01); *F21V 5/043* (2013.01); *F21Y 2101/00* (2013.01); *F21Y 2103/10* (2016.08); *F21Y 2115/10* (2016.08); *H01L 33/38* (2013.01); *H01L 33/44* (2013.01); *H01L 2224/13* (2013.01); *H01L 2224/48091* (2013.01); *H05K 1/021* (2013.01); *H05K 1/0256* (2013.01); *H05K 1/189* (2013.01); *H05K 3/107* (2013.01); *H05K 3/305* (2013.01); *H05K 3/44* (2013.01); *H05K 2201/0338* (2013.01); *H05K 2201/0358* (2013.01); *H05K 2201/0376* (2013.01); *H05K 2201/098* (2013.01); *H05K 2201/09154* (2013.01); *H05K 2201/10106* (2013.01); *H05K 2203/0139* (2013.01); *H05K 2203/025* (2013.01)

(58) Field of Classification Search
CPC ........................................................ F21V 5/04
USPC ....... 362/235–237, 244, 249.01, 249.02, 331
See application file for complete search history.

(56) References Cited

U.S. PATENT DOCUMENTS 7,712,931 B1 * 5/2010 Smith .................. B60Q 1/2611
362/308
2009/0034269 A1 2/2009 Li
(Continued)

FOREIGN PATENT DOCUMENTS

JP 2011014535 A 1/2011
JP 2012104445 A 5/2012
(Continued)

*Primary Examiner* — William Carter
(74) *Attorney, Agent, or Firm* — Harness, Dickey & Pierce, P.L.C.

(57) ABSTRACT

A light source module including a substrate, a plurality of light emitting devices installed on the substrate, and a plurality of lenses installed on the substrate to cover the plurality of light emitting devices, respectively, and each of the plurality of lenses having a pair of open end portions facing one another, the plurality of lenses arranged such that an open end portion of one lens faces an opened end portion of an adjacent lens is provided.

19 Claims, 27 Drawing Sheets

(51) Int. Cl.

| | | |
|---|---|---|
| H01L 33/38 | (2010.01) | |
| H01L 33/44 | (2010.01) | |
| H05K 1/02 | (2006.01) | |
| H05K 1/18 | (2006.01) | |
| H05K 3/10 | (2006.01) | |
| H05K 3/30 | (2006.01) | |
| H05K 3/44 | (2006.01) | |
| F21Y 101/00 | (2016.01) | |

(56) References Cited

U.S. PATENT DOCUMENTS

| | | | |
|---|---|---|---|
| 2010/0296265 A1 | 11/2010 | Kim et al. | |
| 2011/0002125 A1 | 1/2011 | Hwang et al. | |
| 2011/0096560 A1* | 4/2011 | Ryu | C09K 11/0883 |
| | | | 362/510 |
| 2011/0222277 A1* | 9/2011 | Negley | H01L 33/504 |
| | | | 362/235 |
| 2013/0120989 A1* | 5/2013 | Sun | F21S 2/005 |
| | | | 362/244 |

FOREIGN PATENT DOCUMENTS

| | | |
|---|---|---|
| JP | 2012119185 A | 6/2012 |
| KR | 20100004617 A | 1/2010 |
| KR | 100972135 B1 | 7/2010 |
| KR | 101028201 B1 | 4/2011 |
| KR | 20120005987 | 8/2012 |

* cited by examiner

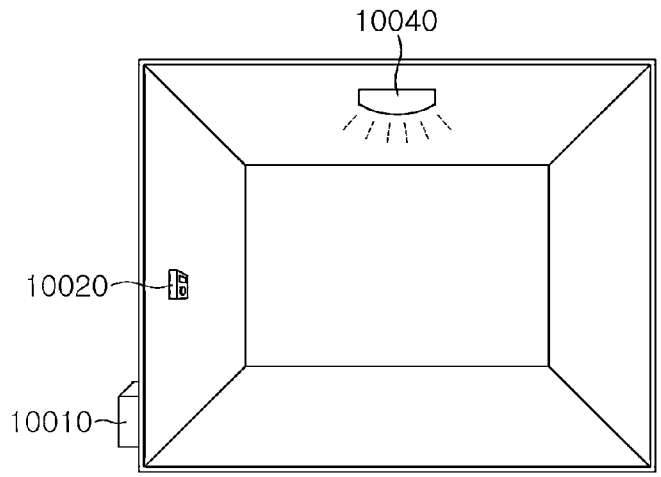
FIG. 29
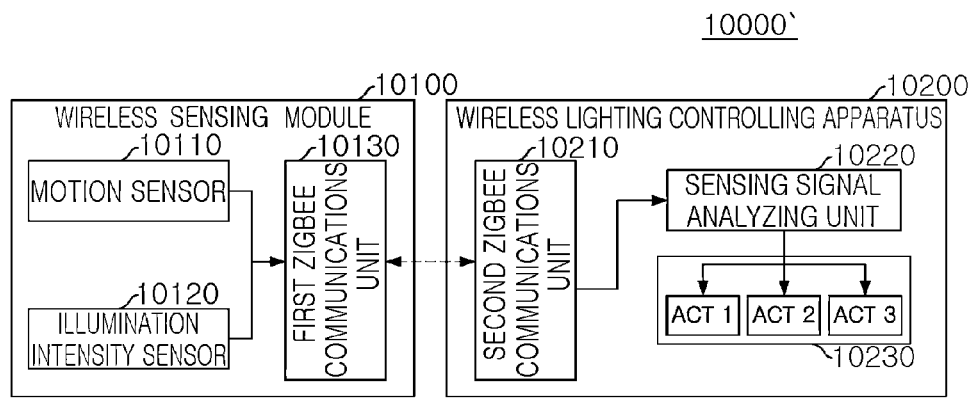
FIG. 30
| CHANNEL INFORMATION (CH) | WIRELESS NETWORK ID INFORMATION (PAN_ID) | DEVICE ADDRESS (Ded_Add) | SENSING DATA (ILLUMINATION INTENSITY VALUE, MOTION VALUE) |
|---|---|---|---|
FIG. 31

LIGHT SOURCE MODULE AND LIGHTING DEVICE HAVING THE SAME

CROSS-REFERENCE TO RELATED APPLICATIONS

This application claims the priority of Korean Patent Application No. 10-2013-0012004 filed on Feb. 1, 2013, in the Korean Intellectual Property Office, the disclosure of which is incorporated herein by reference in its entirety.

BACKGROUND

1. Field

Example embodiments relate to light source modules and/or lighting devices having the same.

2. Description of Related Art

Conventional fluorescent lamps have a relatively short lifespan and consume relatively large amount of power. In order to remedy these shortcomings, recently, fluorescent-type LED lamps using a light emitting diode (LED) have been introduced because they consume a relatively small amount of power and have a relatively long lifespan.

However, the relatively high cost of LED lamps hinders widespread use of the LED lamps. One factor of the relatively high cost of LED lamps is the amount of LEDs to be employed. For example, one hundred to three hundred LEDs are commonly employed in an LED lamp provided to replace a 1200 mm, 40 W fluorescent lamp.

The amount of LEDs employed in LED lamps may be reduced to reduce cost, but decreases in the number of LEDs may cause relatively clear and/or large hot spots due to the sparse arrangement of the LEDs, thereby degrading or deteriorating luminance uniformity.

SUMMARY

Some example embodiments provide light source modules in which the number of LEDs used as light sources can be reduced while minimizing the generation of hot spots, and thus maintaining overall luminance uniformity in the lighting devices, and/or lighting devices including the same.

In one example embodiment, a light source module includes a substrate, a plurality of light emitting devices installed on the substrate, and a plurality of lenses installed on the substrate to cover the plurality of light emitting devices, respectively, and each of the plurality of lenses having a pair of open end portions facing one another. The plurality of lenses may be arranged such that an open end portion of one lens faces an open end portion of an adjacent lens.

Each of the lenses may include a pair of bottom surfaces disposed to be parallel to one another while being in contact with the substrate, an inner surface and an outer surface protruded upwardly from the substrate to connect the pair of bottom surfaces, wherein the pair of open end portions are perpendicular with respect to the pair of bottom surfaces.

Each of the lenses may further include prism patterns formed on the inner surface thereof, and the prism patterns may be a repetition of a pattern between the pair of open end portions.

The prism patterns may be periodically formed such that they are symmetrical, in a direction from one surface to another surface of the pair of opened lateral surfaces, with respect to the center of the lens.

The prism patterns may have a semi-circular shape extending from one bottom surface to the other bottom surface and may be formed to be parallel to the lateral surfaces.

The prism patterns may have peaks protruded from the inner surface of the lenses and angles at the peaks may be increased toward both lateral surfaces from the center of the lenses.

The prism patterns may have a thickness increasing toward both lateral surfaces from the center of the lenses.

The lenses may have a light spreading structure formed on the outer surface thereof.

The lenses may further include a protrusion formed on the outer surface thereof.

The protrusion may be formed to be parallel to the lateral surfaces of the lenses.

The inner surface may be curved and protruded upwardly from the substrate to form a circular arc.

In another example embodiment, a lighting device includes a light source module including a substrate, a plurality of light emitting devices installed on the substrate, and a plurality of lenses installed on the substrate to cover the plurality of light emitting devices, respectively, and each of the plurality of lenses having a pair of open end portions facing one another, the plurality of lenses arranged such that an open end portion of one lens faces an open end portion of an adjacent lens, a body unit configured to be coupled to the light source module; and a terminal unit provided at at least one of two open end portions of the body unit and configured to supply power to the light source module.

Each of the plurality of lenses may have a semi-cylindrical shape with both ends opened. A length direction of each lens may be a direction defined by the pair of open end portions of each lens, e.g., may be a direction from the one open end portion to the other open end portion of each lens.

Each of the lenses may further include prism patterns rotationally symmetrical in a circumferential direction with respect to a central axis through the pair of open end portions. The prism patterns may be symmetrical in the length direction. The prism patterns may be repeatedly and/or periodically formed to be symmetrical in the length direction with respect to the center of the lens in the length direction.

The lighting device may further include a cover unit configured to couple with the body unit to cover the light source module.

In still another example embodiment, a light source module includes a substrate, a light emitting device on the substrate, and a first lens on the light emitting device. The first lens may cover the light emitting device in a first direction and expose the light emitting device in a second direction.

The first and second directions may be perpendicular to each other.

The first lens may have a first pair of open end portions, the first pair of open end portions disposed in the second direction and facing each other.

The light source module further includes a second lens neighboring the first lens. One of the first pair of open end portions of the first lens may face one of a second pair of open end portions of the second lens.

The first lens may include light reflecting patterns at an inner surface thereof and between the first pair of open end portions.

The inner surface of the first lens may have a semi-elliptical cross-section in the first direction.

BRIEF DESCRIPTION OF THE DRAWINGS

The above and other aspects, features and other advantages of example embodiments will be more clearly understood from the following detailed description taken in conjunction with the accompanying drawings, in which:

FIG. 29 is a view schematically illustrating the way in which the lighting system illustrated in FIG. 26 is used;

FIG. 30 is a block diagram of a lighting system according to another example embodiment;

FIG. 31 is a view illustrating a format of a ZigBee signal according to an example embodiment;

DETAILED DESCRIPTION

Figure 1:
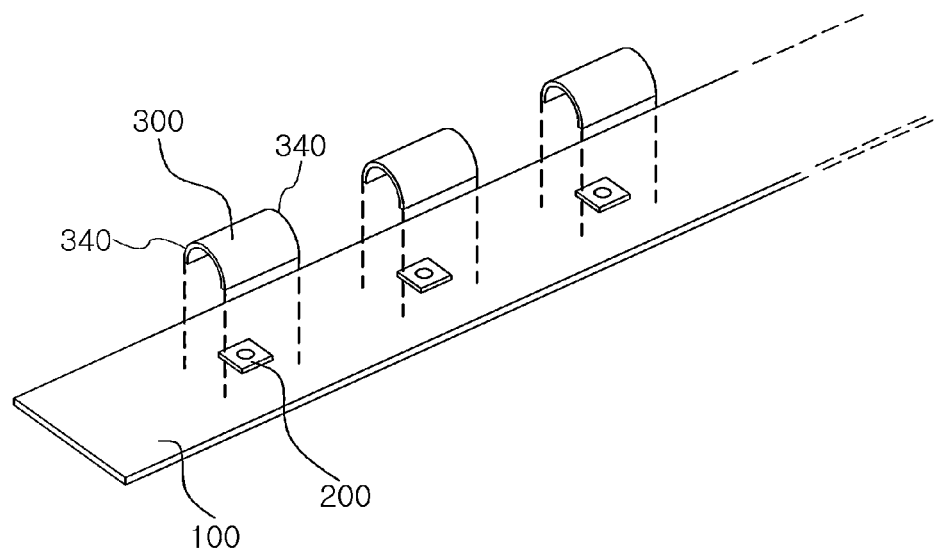
FIG. 1 is a schematic perspective view of a light source module according to an example embodiment.

Example embodiments will now be described in detail with reference to the accompanying drawings. Example embodiments may, however, be embodied in many different forms and should not be construed as being limited to the example embodiments set forth herein. Rather, these example embodiments are provided so that this disclosure will be thorough and complete, and will fully convey the scope of example embodiments to those skilled in the art. In the drawings, the shapes and dimensions of elements may be exaggerated for clarity, and the same reference numerals will be used throughout to designate the same or like components.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A light source module according to an example embodiment will be described with reference to FIGS. 1 and 2. FIG. 1 is a schematic perspective view of a light source module according to an example embodiment, and FIGS. 2A and 2B are a side view and a front view schematically illustrating the light source module in FIG. 1.

Figure 2A:
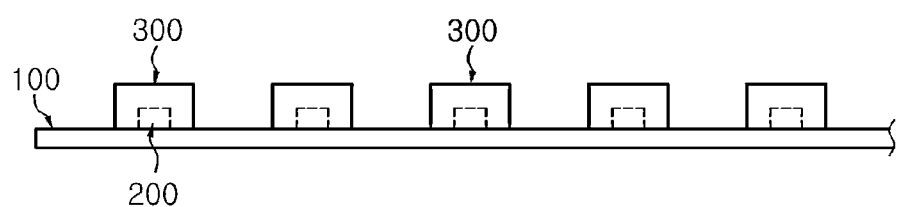
FIGS. 2A and 2B are a side view and a front view schematically illustrating the light source module in FIG. 1.
Figure 2B:
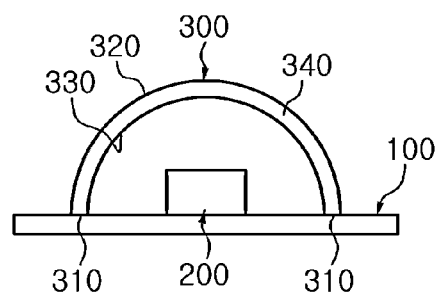

Referring to FIGS. 1 and 2A and 2B, a light source module 10 according to an example embodiment may include a substrate 100, a plurality of light emitting devices 200, and a plurality of lens 300.

The substrate 100 may be a general FR4 type PCB and may be made of an organic resin material containing epoxy, triazine, silicon, polyimide, or the like, any other organic resin material, a ceramic material based on, e.g., silicon nitride, AlN, $Al_2O_3$, or the like, metal, or a metal compound. The substrate 100 may include a metal-core printed circuit board (MCPCB), a metal copper clad laminate (MCCL), or the like.

Hereinafter, various substrate structures that may be employed in the present example embodiment will be described.

Figure 3:
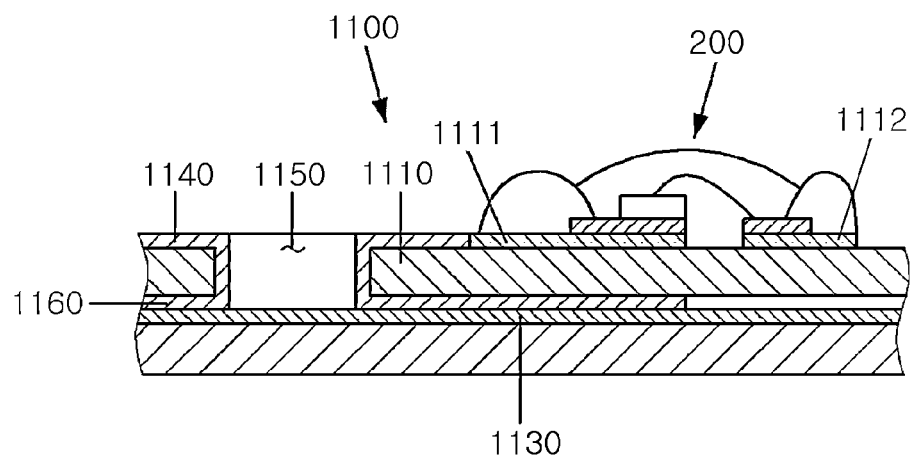
FIG. 3 is a cross-sectional view schematically illustrating a configuration of a substrate that may be employed in the light source module in FIG. 1.

As illustrated in FIG. 3, a substrate 1100 may include an insulating substrate 1110 having desired (or, alternatively predetermined) circuit patterns 1111 and 1112, which are formed on one surface of the insulating substrate 1110, an upper thermal diffusion plate 1140 formed on the insulating substrate 1110 such that the upper thermal diffusion plate 1140 is in contact with the circuit patterns 1111 and 1112, and dissipates heat generated by the light emitting device 200, and a lower thermal diffusion plate 1160 formed on the other surface of the insulating substrate 1110 and configured to outwardly transmit heat, which is transmitted from the upper thermal diffusion plate 1140. The upper thermal diffusion plate 1140 and the lower thermal diffusion plate 1160 may be connected to and exchange heat with each other via at least one through hole 1150, which penetrates through the insulating layer 1110 and has inner walls plated with a heat-conductive material.

In the insulating substrate 1110, the circuit patterns 1111 and 1112 may be formed by cladding a ceramic with copper or epoxy resin-based FR4 and performing an etching process thereon. An insulating thin film 1130 may be formed by coating an insulating material on a lower surface of the substrate 1110.

Figure 4:
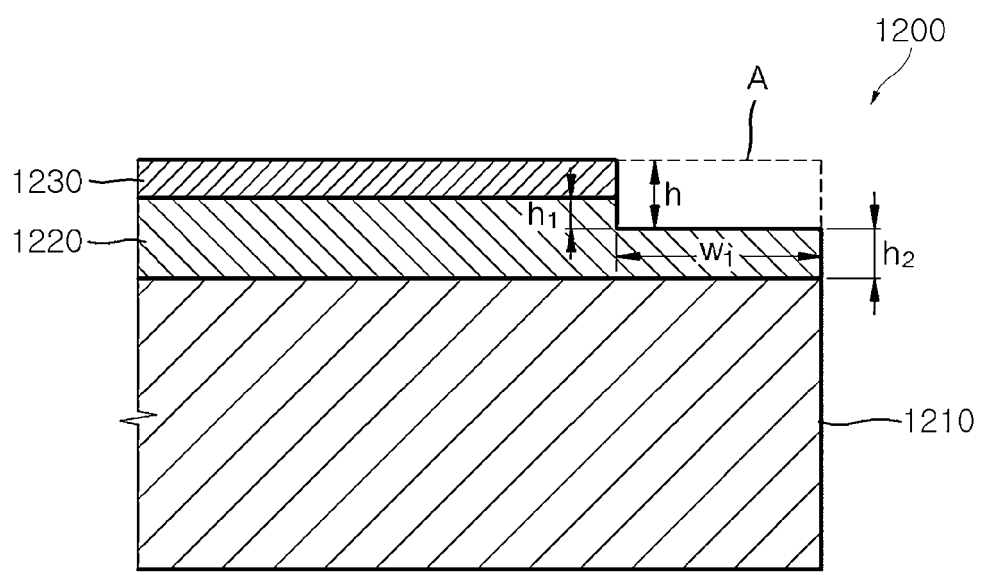
FIG. 4 is a cross-sectional view schematically illustrating another example embodiment of the substrate.

FIG. 4 illustrates another example of a substrate. As illustrated in FIG. 4, a substrate 1200 includes a first metal layer 1210, an insulating layer 1220 formed on the first metal layer 1210, and a second metal layer 1230 formed on the insulating layer 1220. A step region 'A' exposing the insulating layer 1220 may be formed in at least one end portion of the substrate 1200.

The first metal layer 1210 may be made of a material having excellent exothermic characteristics. For example, the first metal layer 1210 may be made of a metal such as aluminum (Al), iron (Fe), or the like, or an alloy thereof. The first metal layer 1210 may have a uni-layer structure or a multilayer structure. The insulating layer 1220 may be made of a material having insulating properties, and may be formed of an inorganic material or an organic material. For example, the insulating layer 1220 may be made of an epoxy-based insulating resin, and may include metal powder such as aluminum (Al) powder, or the like, in order to enhance thermal conductivity. The second metal layer 1230 may be formed of, e.g., a copper (Cu) thin film.

As illustrated in FIG. 4, in the metal substrate according to the present example embodiment, an insulation length, which is a length of the insulating layer 1220 exposed at, for instance, one end portion of the insulating layer 1220. Thus, the insulation length may be greater than a thickness of the insulating layer 1220. In other words, the insulation length refers to a length of the insulating layer 1220 exposed between the first metal layer 1210 and the second metal layer 1230. When the metal substrate 1200 is viewed from above, a width of the exposed region of the insulating layer 1220 is an exposure width W1. The region 'A' in FIG. 4 is removed through a grinding process, or the like, during the manufacturing process of the metal substrate. The second metal layer 1230 and the insulating layer 1120 may be removed to a depth 'h' downwardly from a surface of the second metal layer 1230 to expose the insulating layer 1220 by the exposure width W1, thereby forming a step structure. If the end portion of the metal substrate 1200 is not removed, the insulation length may be equal to a thickness (h1+h2) of the insulating layer 1220. By removing a portion of the end portion of the metal substrate 1220, an insulation length equal to approximately W1 may be additionally secured. Thus, when a withstand voltage of the metal substrate 1200 is tested, the likelihood of an electrical shortage between the two metal layers 1210 and 1230 at the end portions thereof may be minimized or prevented.

Figure 5:
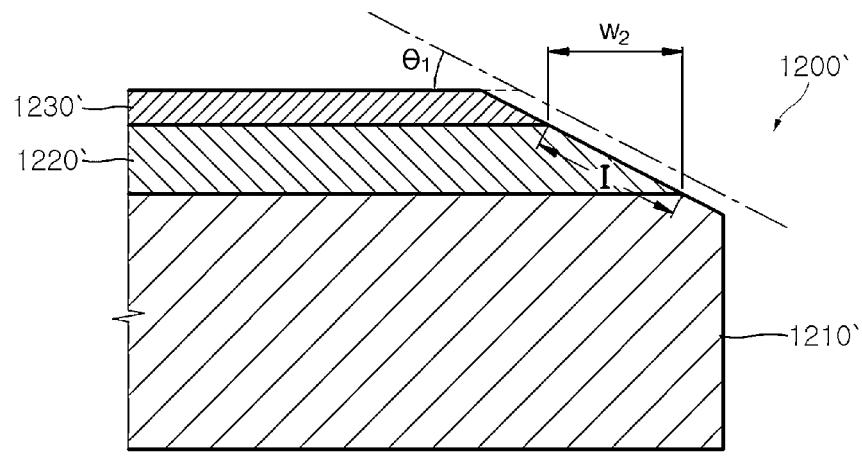
FIG. 5 is a cross-sectional view schematically illustrating a modification of the substrate in FIG. 4.

FIG. 5 is a view schematically illustrating a structure of a metal substrate according to a modification of FIG. 4. Referring to FIG. 5, a metal substrate 1200' includes a first metal layer 1210', an insulating layer 1220' formed on the first insulating layer 1220', and a second metal layer 1230' formed on the insulating layer 1220'. The insulating layer 1220' and the second metal layer 1230' include regions removed at a desired (or, alternatively predetermined) tilt angle θ1, and the first metal layer 1210' may also include a region removed at the desired (or, alternatively predetermined) tilt angle θ1.

The tilt angle θ1 may be an angle between the upper surface of insulating layer 1220' (or, alternatively the bottom surface of the second metal layer 1230') and the inclined side surface of the insulating layer 1220'. The tilt angle θ1 may be selected to secure a desired insulation length I in consideration of a thickness of the insulating layer 1220'. The inclination angle θ1 may be selected from within the range of 0<θ1<90 (degrees). As the inclination angle θ1 decreases, the insulation length I and a projected width W2 of the exposed region of the insulating layer 1220' increases. Thus, in order to secure a larger insulation length, the inclination angle θ1 may be selected to be smaller. For example, the inclination angle may be selected from within the range of 0<θ1≤45 (degrees).

Figure 6:
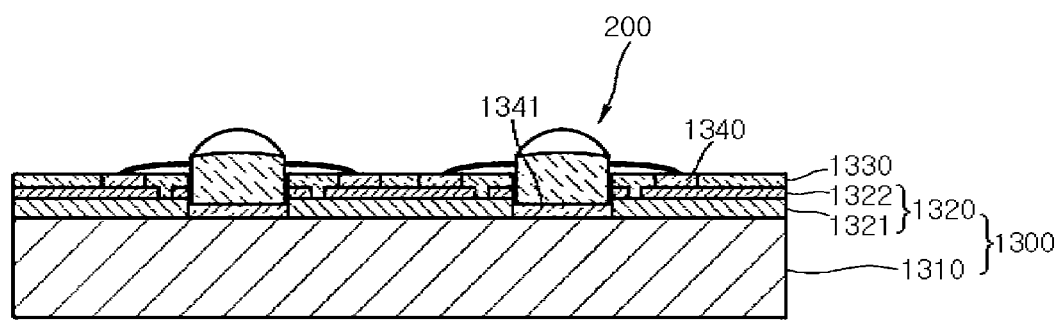
FIGS. 6 through 9 are cross-sectional views schematically illustrating various example embodiments of the substrate.

FIG. 6 schematically illustrates another example embodiment of a substrate. Referring to FIG. 6, a substrate 1300 includes a metal support substrate 1310 and resin-coated copper (RCC) 1320 formed on the metal support substrate 1310. The RCC 1320 may include an insulating layer 1321 and a copper foil 1322 laminated on the insulating layer 1321. A portion of the RCC 1320 may be removed to form at least one recess in which the light emitting device 200 may be installed. The metal substrate 1300 may have a structure in which the RCC 1320 is partially removed to accommodate the light emitting device 200 and the light emitting device 200 is in direct contact with the metal support substrate 1310. Thus, heat generated by the light emitting device 200 may be directly transmitted to the metal support substrate 1310, thereby enhancing heat dissipation performance. The light emitting device 200 may be electrically connected to the metal support substrate 1610 and solders 1340 and 1341, and may attach the light emitting device 14001 to the metal support substrate 1610. A protective layer 1330 made of a liquid photo solder resist (PSR) may be formed on an upper portion of the copper foil 1322.

Figure 7A:
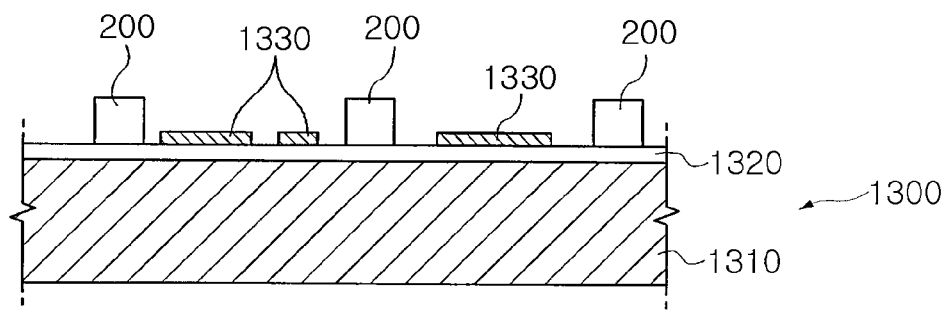
Figure 7B:
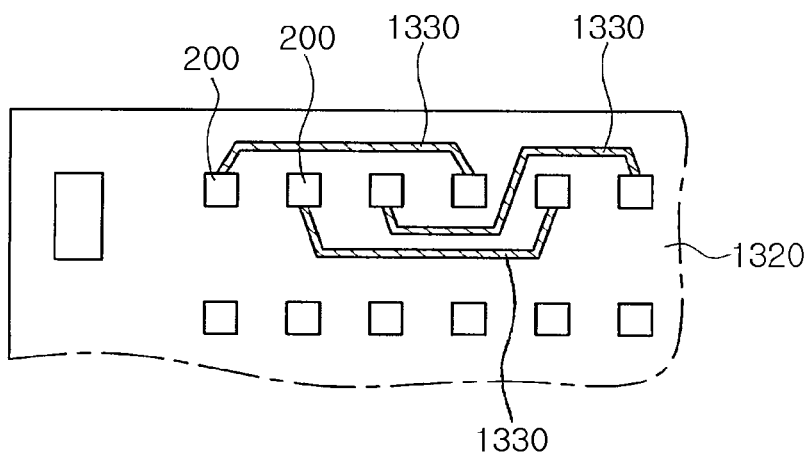

FIG. 7 schematically illustrates another example embodiment of a substrate. A substrate according to the present example embodiment includes an anodized metal substrate having improved heat dissipation characteristics and incurring lower manufacturing costs. Referring to FIG. 7A, the anodized metal substrate 1300 may include a metal plate 1310, an anodic oxide film 1320 formed on the metal plate 1310, and electrical wirings 1330 formed on the anodic oxide film 1320. The light emitting device 200 may be mounted on the anodic oxide film 1320, and may be electrically connected to the electrical wirings 1330.

The metal plate 1310 may be made of aluminum (Al) or an Al alloy that may be easily obtained at a lower cost. The metal plate 1310 may be made of any other anodizable metal, e.g., titanium (Ti), magnesium (Mg), etc.

The anodic oxide film 1320 may be formed of aluminum oxide film ($Al_2O_3$) obtained by anodizing aluminum has a relatively high heat transmission characteristics ranging from about 10 W/mK to 30 W/mK. Thus, the anodized metal substrate 1300 has better heat dissipation characteristics conventional polymer substrates, e.g., a PCB, an MCPCB, etc.

Figure 8:
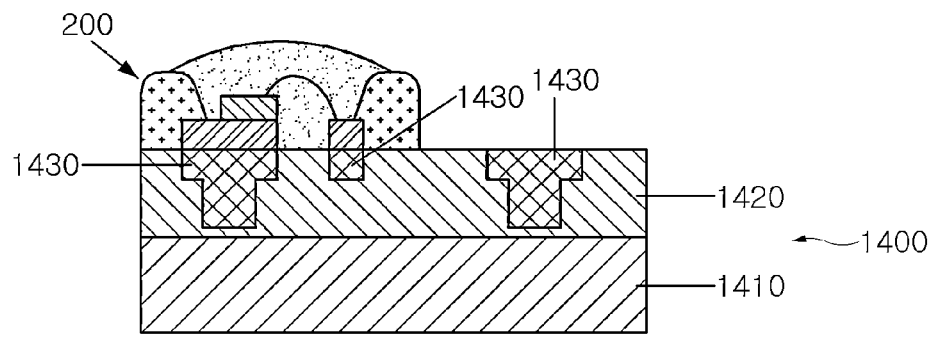

FIG. 8 schematically illustrates another example of a substrate. As illustrated in FIG. 8, a substrate 1400 may include a metal substrate 1410, an insulating resin 1420 coated on the metal substrate 1410, and a circuit pattern 1430 formed on the insulating resin 1420. For example, the insulating resin 1420 may have a thickness equal to or less than 200 μm. The insulating resin 1420 may be laminated on the metal substrate 1410 in the form of a solid film or may be coated in the liquid form using spin coating or a blade. Also, the circuit pattern 1430 may be formed by filling a metal such as copper (Cu), etc., in a circuit pattern intaglioed or engraved on the insulting layer 1420. The light emitting device 200 may be mounted to be electrically connected to the circuit pattern 1430.

Figure 9:
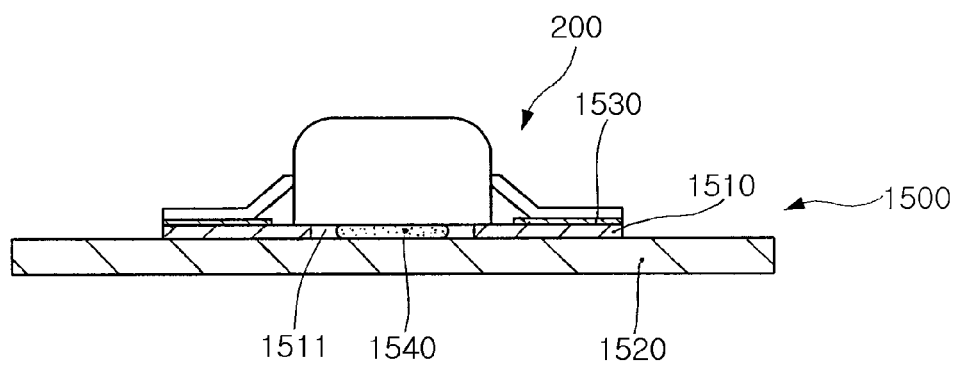

The substrate may include a flexible PCB (FPCB) that can be easily deformed. As illustrated in FIG. 9, a substrate 1500 may include a flexible circuit board 1510 having one or more through holes 1511, and a support substrate 1520 on which the flexible circuit board 1510 is mounted. A heat dissipation adhesive 1540 may be provided in the through hole 1511 to couple a lower surface of the light emitting device 200 and an upper surface of the support substrate 1520. The lower surface of the light emitting device 200 may be a lower surface of a chip package, a lower surface of a lead frame having an upper surface on which a chip is mounted, or a metal block. A circuit wiring 1530 may be formed on the flexible circuit board 1510 and electrically connected to the light emitting device 200.

When the flexible circuit board 1510 is used, thickness and/or weight of the circuit board 1500 may be reduced, and thus manufacturing costs may be reduced. Because the light emitting device 200 is directly bonded to the support substrate 1520 by the heat dissipation adhesive 1540, heat dissipation efficiency in dissipating heat generated by the light emitting device 200 can be increased.

The foregoing substrate 100 of FIG. 1 may have a flat plate shape and/or a rectangular shape in which a length in a length direction is longer than a width in a width direction.

In the present example embodiment, the substrate 100 is illustrated as having a bar-like shape and a structure extending in the length direction, but example embodiments are not limited thereto. For example, the substrate 100 may have a square shape or any other polygonal shape.

Referring to FIG. 1, the plurality of light emitting devices 200 may be mounted on the substrate 100 and electrically connected thereto. Each of the light emitting devices 200, types of semiconductor device generating light having a desired (or, alternatively predetermined) wavelength by power applied from the outside, may include a light emitting diode (LED). The light emitting device 200 may emit blue light, green light, or red light according to a material or materials contained therein, or may emit white light.

Hereinafter, various light emitting devices that may be employed in the present example embodiment will be described.

Light Emitting Device

First Example

Figure 10:
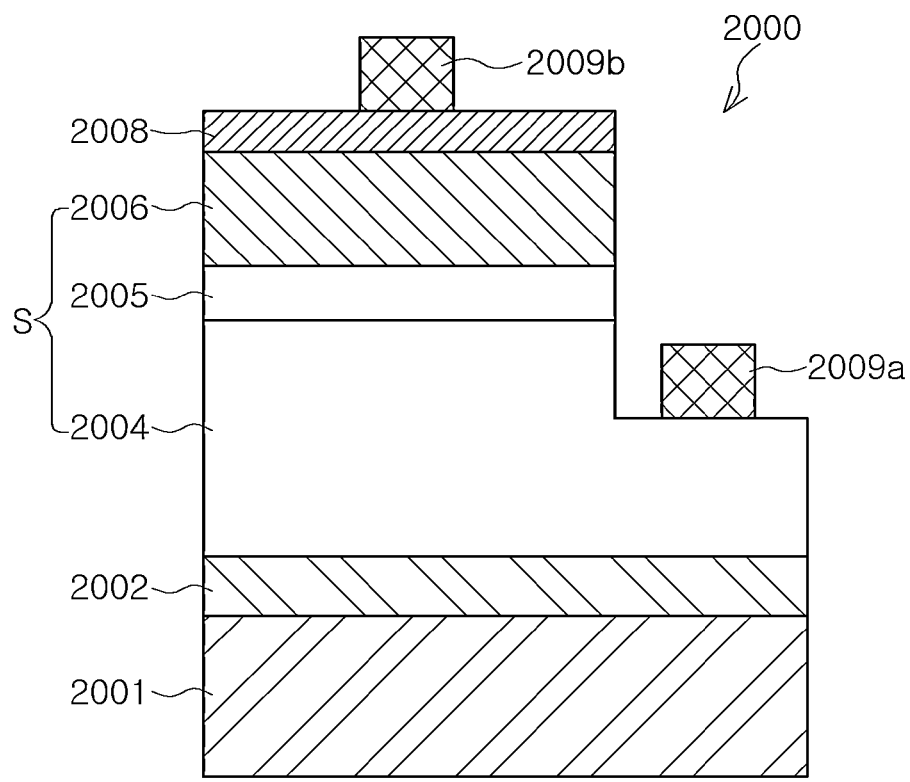
FIG. 10 is a cross-sectional view schematically illustrating an example embodiment of a light emitting device (an LED chip) that may be employed in the light source module in FIG. 1.

FIG. 10 is a cross-sectional view schematically illustrating an example of a light emitting device (an LED chip).

As illustrated in FIG. 10, a light emitting device 2000 may include a light emitting laminate S formed on a substrate 2001. The light emitting laminate S may include a first conductivity-type semiconductor layer 2004, an active layer 2005, and a second conductivity-type semiconductor layer 2006.

An ohmic-contact layer 2008 may be formed on the second conductivity-type semiconductor layer 2006, and first and second electrodes 2009a and 2009b may be formed on upper surfaces of the first conductivity-type semiconductor layer 2004 and the ohmic-contact layer 2008, respectively.

In the present disclosure, terms such as 'upper portion', 'upper surface', 'lower portion', 'lower surface', 'lateral surface', etc., are determined based on the drawings, and in actuality, the terms may be changed according to a direction in which a light emitting device is disposed.

Hereinafter, major components of the light emitting device will be described.

[Substrate]

A substrate constituting a light emitting element may be a growth substrate for epitaxial growth. For example, the substrate 2001 may be an insulating substrate, a conductive substrate, or a semiconductor substrate. For example, sapphire, SiC, Si, $MgAl_2O_4$, MgO, $LiAlO_2$, $LiGaO_2$, or GaN may be used as a material of the substrate 2001. For epitaxial growth of a GaN material, a GaN substrate (e.g. a homogeneous substrate) may be desirable, but the GaN substrate incurs high production costs due to the manufacturing difficulties.

Thus, a heterogeneous substrate, e.g., a sapphire substrate, a silicon carbide substrate, etc., may be used. The sapphire substrate is utilized relatively more than the relatively costly silicon carbide substrate. When a heterogeneous substrate is used, defects, e.g., dislocation may be increased due to differences in lattice constants between a substrate material and a thin film material. Also, differences in coefficients of thermal expansion between the substrate material and the thin film material may cause bowing or warpage due to changing temperatures, and the bowing may cause cracks in the thin film. Such a problem may be reduced by using a buffer layer 2002 between the substrate 2001 and the GaN-based light emitting laminate S.

The substrate 2001 may be fully or partially removed or patterned during a chip manufacturing process in order to enhance optical or electrical characteristics of the LED chip before or after the LED structure is grown.

For example, in the case that a sapphire substrate is employed, the substrate may be separated by irradiating a laser onto an interface between the substrate and a semiconductor layer through the substrate, and in the case of a silicon substrate or a silicon carbide substrate, the substrate may be removed through, for instance polishing/etching a method.

In removing the substrate, a support substrate may be used. For example, the support substrate may be attached to the opposite side of the original growth substrate by using a reflective metal or a reflective structure may be inserted into a middle portion of a bonding layer to enhance luminance efficiency of the LED chip.

The substrate 2001 may be patterned to form depressions and protrusions (or an uneven portion) or a sloped portion at a main surface (one or both of top and bottom surfaces) or at a lateral surface of the substrate before or after the growth of the LED structure to enhance light extraction efficiency. A pattern size may be selected within the range from 5 nm to 500 μm, and any pattern may be employed as long as it can enhance light extraction efficiency as a regular or an irregular pattern. The pattern may have various shapes such as a columnar shape, a peaked shape, a hemispherical shape, a polygonal shape, etc.

In the case that a sapphire substrate is employed, the sapphire substrate may be a crystal having Hexa-Rhombo R3c symmetry, of which lattice constants in c-axial and a-axial directions are approximately 13.001 Å and 4.758 Å, respectively, and having a C-plane (0001), an A-plane (1120), an R-plane (1102), etc. Because sapphire crystal is stable at high temperatures, a nitride thin film may be relatively easily grown on the C-plane of the sapphire crystal. Accordingly, the sapphire substrate is commonly used as a nitride growth substrate.

The substrate 2001 may also be made of silicon (Si). Because a silicon (Si) substrate is more appropriate for increasing a diameter and is relatively low in price, it may be used to facilitate mass-production. A difference in lattice constants between the silicon substrate having (111) plane as a substrate surface and GaN is approximately 17%. Thus, a technique of suppressing the generation of crystal defects due to the difference between the lattice constants may be required. Also, a difference in coefficients of thermal expansion between silicon and GaN is approximately 56%. Thus, a technique of suppressing bowing of a wafer generated due to the difference in the coefficients of thermal expansion may be required. Bowed wafers may result in cracks in the GaN thin film and make it difficult to control processes to increase dispersion of emission wavelengths (or excitation wavelengths) of light in the wafer.

The silicon substrate may absorb light generated in the GaN-based semiconductor, thereby lowering external quantum yield of the light emitting device. Thus, the substrate may be removed and a support substrate such as a silicon substrate, a germanium substrate, a SiAl substrate, a ceramic substrate, a metal substrate, or the like, including a reflective layer may be additionally formed.

[Buffer Layer]

When a GaN thin film is grown on a heterogeneous substrate, e.g., the silicon substrate, dislocation density may be increased due to a lattice constant mismatch between a substrate material and a thin film material, and cracks and warpage (or bowing) may be generated due to a difference between thermal expansion coefficients. In order to prevent dislocation of and cracks in the light emitting laminate S, the buffer layer 2002 may be disposed between the substrate 2001 and the light emitting laminate S. The buffer layer 2002 may serve to adjust a degree of warpage of the substrate when an active layer is grown, and to reduce a wavelength dispersion of a wafer.

The buffer layer 2002 may be made of $Al_xIn_yGa_{1-x-y}N$ (0≤x≤1, 0≤y≤1), in particular, GaN, AlN, AlGaN, InGaN, or InGaNAlN, and a material such as $ZrB_2$, $HfB_2$, ZrN, HfN, TiN, or the like, may also be used. Also, the buffer layer may be formed by combining a plurality of layers or by gradually changing a composition.

A silicon (Si) substrate has a thermal expansion coefficient significantly different from that of GaN. Thus, in the case of growing a GaN-based thin film on the silicon substrate, when a GaN thin film is grown at a high temperature and is subsequently cooled to room temperature, tensile stress may be applied to the GaN thin film due to the difference in the coefficients of thermal expansion between the silicon substrate and the GaN thin film, thereby generating cracks. In order to prevent or reduce the generation of cracks, a method of growing the GaN thin film such that compressive stress is applied to the GaN thin film may be used to compensate for the tensile stress.

A difference in the lattice constants between silicon (Si) and GaN may generate defects being generated therein. In the case that a silicon substrate is employed, a buffer layer having a composite structure may be used to control stress such that warpage (or bowing) and/or defects are restrained or controlled.

For example, first, an AlN layer is formed on the substrate 1001. In this case, a material not including gallium (Ga) may be used in order to prevent a reaction between silicon (Si) and gallium (Ga). Besides AlN, a material such as SiC, or the like, may also be used. The AlN layer is grown at a temperature ranging from 400° C. to 1,300° C. by using an aluminum (Al) source and a nitrogen (N) source. An AlGaN intermediate layer may be inserted into the center of GaN between the plurality of AlN layers to control stress.

[Light Emitting Laminate]

The light emitting laminate S having a multilayer structure of a Group III nitride semiconductor will be described in detail. The first and second conductivity-type semiconductor layers 2004 and 2006 may be formed of n-type and p-type impurity-doped semiconductors, respectively.

However, example embodiments are not limited thereto. Thus, the first and second conductivity-type semiconductor layers 2004 and 2006 may be formed of p-type and n-type impurity-doped semiconductors, respectively. For example, the first and second conductivity-type semiconductor layers 2004 and 2006 may be made of a Group III nitride semiconductor, e.g., a material having a composition of $Al_xIn_yGa_{1-x-y}N$ ($0 \leq x \leq 1$, $0 \leq y \leq 1$, $0 \leq x+y \leq 1$). Of course, example embodiments are not limited thereto and the first and second conductivity-type semiconductor layers 2004 and 2006 may also be made of a material such as an AlGaInP-based semiconductor or an AlGaAs-based semiconductor.

The first and second conductivity-type semiconductor layers 2004 and 2006 may have a uni-layer structure, or, alternatively, the first and second conductivity-type semiconductor layers 2004 and 2006 may have a multilayer structure including layers having, e.g., different compositions, thicknesses, etc. For example, the first and second conductivity-type semiconductor layers 2004 and 2006 may have a carrier injection layer for improving electron and hole injection efficiency, or may have various types of superlattice structure, respectively.

The first conductivity-type semiconductor layer 2004 may further include a current diffusion layer (not shown) in a region adjacent to the active layer 2005. The current diffusion layer may have a structure in which a plurality of $In_xAl_yGa_{(1-x-y)}N$ layers having different compositions or different impurity contents are iteratively laminated or may have an insulating material layer partially formed therein.

The second conductivity-type semiconductor layer 2006 may further include an electron blocking layer (not shown) in a region adjacent to the active layer 2005. The electron blocking layer may have a structure in which a plurality of $In_xAl_yGa_{(1-x-y)}N$ layers having different compositions are laminated or may have one or more layers including $Al_yGa_{(1-y)}N$. The electron blocking layer has a bandgap wider than that of the active layer 2005, thus preventing electrons from being transferred via the second conductivity-type (p-type) semiconductor layer 2006.

The light emitting laminate S may be formed by using metal-organic chemical vapor deposition (MOCVD). In order to fabricate the light emitting laminate S, an organic metal compound gas (e.g., trimethyl gallium (TMG), trimethyl aluminum (TMA)) and a nitrogen-containing gas (e.g., ammonia ($NH_3$)) may be supplied to a reaction container in which the substrate 2001 is installed as reactive gases, while the substrate may be maintained at a high temperature ranging from 900° C. to 1,100° C. While a gallium nitride-based compound semiconductor is being grown, an impurity gas may be supplied to laminate the gallium nitride-based compound semiconductor as a doped n-type or p-type semiconductor. Silicon (Si) is a well-known n-type impurity and p-type impurity includes zinc (Zn), cadmium (Cd), beryllium (Be), magnesium (Mg), calcium (Ca), barium (Ba), etc. Among them, magnesium (Mg) and zinc (Zn) may be mainly used.

Also, the active layer 2005 disposed between the first and second conductivity-type semiconductor layers 2004 and 2006 may have a multi-quantum well (MQW) structure in which a quantum well layer and a quantum barrier layer are alternately laminated. For example, in the case of a nitride semiconductor, a GaN/InGaN structure may be used, or a single quantum well (SQW) structure may also be used.

[Ohmic-Contact Layer and First and Second Electrodes]

The ohmic-contact layer 2008 may have a relatively high impurity concentration to have low ohmic-contact resistance, thereby lowering an operating voltage of the element and enhance element characteristics. The ohmic-contact layer 2008 may be formed of a GaN layer, a InGaN layer, a ZnO layer, or a graphene layer.

The first or second electrode 2009a or 2009b may be made of a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like, and may have a structure including two or more layers such as Ni/Ag, Zn/Ag, Ni/Al, Zn/Al, Pd/Ag, Pd/Al, Ir/Ag. Ir/Au, Pt/Ag, Pt/Al, Ni/Ag/Pt, or the like.

The LED chip illustrated in FIG. 10 has a structure in which first and second electrodes face the same surface as a light extraction surface, but it may also be implemented to have various other structures, such as a flip-chip structure in which first and second electrodes face a surface opposite to a light extraction surface, a vertical structure in which first and second electrodes are formed on mutually opposing surfaces, a vertical and horizontal structure employing an electrode structure by forming several vias in a chip as a structure for enhancing current spreading efficiency and heat dissipation efficiency, etc.

Light Emitting Device

Second Example

Figure 11:
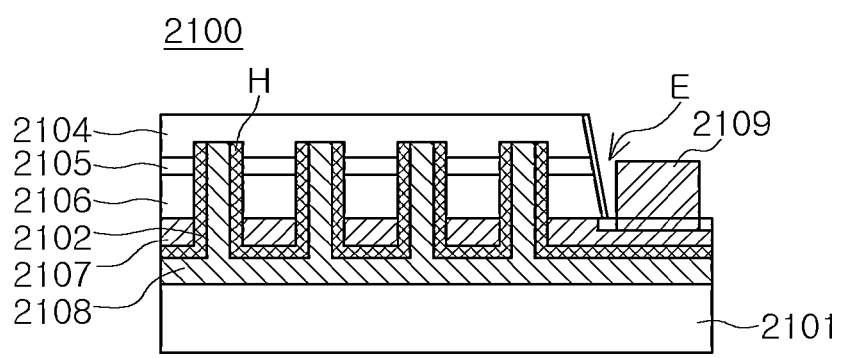
FIG. 11 is a cross-sectional view schematically illustrating another example embodiment of a light emitting device (an LED chip) that may be employed in the light source module in FIG. 1.

In case of manufacturing a large light emitting device for a high output, an LED chip illustrated in FIG. 11 having a structure promoting current spreading efficiency and heat dissipation efficiency may be provided.

As illustrated in FIG. 11, the LED chip 2100 may include a first conductivity-type semiconductor layer 2104, an active layer 2105, a second conductivity-type semiconductor layer 2106, a second electrode layer 2107, an insulating layer 2102, a first electrode 2108, and a substrate 2101, laminated sequentially. Here, in order to be electrically connected to the first conductivity-type semiconductor layer 2104, the first electrode layer 2108 includes one or more contact holes H extending from one surface of the first electrode layer 2108 to at least a partial region of the first conductivity-type semiconductor layer 2104 and electrically insulated from the second conductivity-type semiconductor layer 2106 and the active layer 2105. However, the first electrode layer 2108 may not be included in some of example embodiments.

The contact hole H may extend from an interface between the first electrode layer 2108 and the second electrode layer 2017, passing through the second electrode layer 2107, the second conductivity-type semiconductor layer 2106, and the first active layer 2105, to the interior of the first conductivity-type semiconductor layer 2104. The contact hole H may extend at least to an interface between the active layer 2105 and the first conductivity-type semiconductor layer 2104. The contact hole H may extend to a portion of the first conductivity-type semiconductor layer 2104. Because the contact hole H is formed for electrical connectivity and current spreading, the purpose of the presence of the contact hole H is achieved when it is in contact with the first conductivity-type semiconductor layer 2104. Thus, the contact hole H may not extend to an external surface of the first conductivity-type semiconductor layer 2104.

The second electrode layer 2107 formed on the second conductivity-type semiconductor layer 2106 may be selectively made of a material among silver (Ag), nickel (Ni), aluminum (Al), rhodium (Rh), palladium (Pd), iridium (Ir), ruthenium (Ru), magnesium (Mg), zinc (Zn), platinum (Pt), gold (Au), etc., in consideration of a light reflecting function and an ohmic-contact function with the second conductivity-type semiconductor layer 2106, and may be formed by using a process such as sputtering, deposition, or the like.

The contact hole H may have a form penetrating the second electrode layer 2107, the second conductivity-type semiconductor layer 2106, and the active layer 2105 so as to be connected to the first conductivity-type semiconductor layer 2104. The contact hole H may be formed by using an etching process, e.g., inductively coupled plasma-reactive ion etching (ICP-RIE).

The insulating layer 2102 may be formed to cover a side wall of the contact hole H and a lower surface of the second conductivity-type semiconductor layer 2106. For example, at least a portion of the first conductivity-type semiconductor layer 2104 may be exposed by the contact hole H. The insulating layer 2102 may be formed by depositing an insulating material such as $SiO_2$, $SiO_xN_y$, or $Si_xN_y$.

The first electrode layer 2108 may include a conductive via portion, which is formed by filling the contact hole H with a conductive material. Subsequently, the substrate 2101 may be formed on the first electrode layer 2108. In this structure, the substrate 2101 may be electrically connected to the first conductivity-type semiconductor layer 2104 via the conductive via portion.

The substrate 2101 may be made of a material including any one of Au, Ni, Al, Cu, W, Si, Se, GaAs, SiAl, Ge, SiC, AlN, $Al_2O_3$, GaN, AlGaN and may be formed through a process such as plating, sputtering, deposition, bonding, or the like. However, example embodiments are not limited thereto.

In order to reduce contact resistance, the amount, a shape, a pitch, and/or a contact area of the contact hole H with respect to the first and second conductivity-type semiconductor layers 2104 and 2106 may be appropriately regulated. The contact holes H may be arranged to have various shapes in rows and columns to improve a current flow. For example, the second electrode layer 2107 may have one or more exposed regions in the interface between the second electrode layer 2017 and the second conductivity-type semiconductor layer 2106, e.g., an exposed region E. An electrode pad unit 2109 connecting an external power source to the second electrode layer 2107 may be provided on the exposed region E.

In this manner, the LED chip 2100 illustrated in FIG. 11 may include the light emitting structure having the first and second main surfaces opposing one another and having the first and second conductivity-type semiconductor layers 2104 and 2106 providing the first and second main surfaces, respectively, and the active layer 2105 formed therebetween, the contact holes H connected to a region of the first conductivity-type semiconductor layer 2104 through the active layer 2105 from the second main surface, the first electrode layer 2108 formed on the second main surface of the light emitting structure and connected to a region of the first conductivity-type semiconductor layer 2104 through the contact holes H, and the second electrode layer 2107 formed under the second main surface of the light emitting structure and connected to the second conductivity-type semiconductor layer 2106. For example, any one of the first and second electrodes 2108 and 2107 may be drawn out in a lateral direction of the light emitting structure.

Light Emitting Device

Third Example

An LED lighting device provides improved heat dissipation characteristics. Further, the LED lighting device employing an LED chip may have a relatively low heating value. As an LED chip satisfying such requirements, an LED chip including a nano-structure (hereinafter, referred to as a 'nano-LED chip') may be used.

Such a nano-LED chip may include a recently developed core/shell type nano-LED chip, which has a low binding density to generate a relatively low degree of heat, has increased luminous efficiency by increasing a light emitting region by utilizing nano-structures, and may minimize or prevent a degradation of efficiency due to polarization by obtaining a non-polar active layer, thereby improving drop characteristics.

Figure 12:
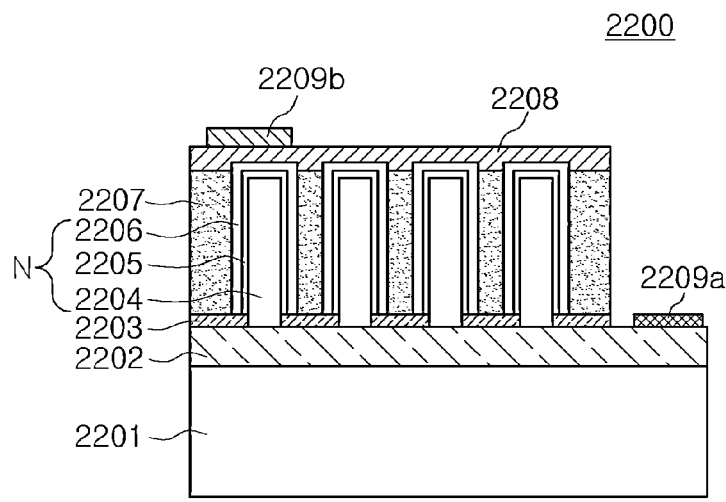
FIG. 12 is a cross-sectional view schematically illustrating still another example of a light emitting device (an LED chip) that may be employed in the light source module in FIG. 1.

FIG. 12 is a cross-sectional view illustrating still another example of an LED chip that may be employed in a light source module.

As illustrated in FIG. 12, a nano-LED chip 2200 may include a plurality of nano-scale light emitting structures N formed on a substrate 2201. In this example embodiment, the nano-light emitting structure N has a core-shell structure as a rod structure is illustrated. However, example embodiments are not limited thereto and the nano-light emitting structure N may have a different structure such as a pyramid structure.

The nano-LED chip 2200 may include a base layer 2202 formed on the substrate 2201. The base layer 2202 may be a layer providing a growth surface for the nano-scale light emitting structure N. The base layer 2202 may be a first conductivity-type semiconductor layer. A mask layer 2203 having an open area for the growth of the nano-scale light emitting structure (in particular, the core) may be formed on the base layer 2202. The mask layer 2203 may be made of a dielectric material, e.g., $SiO_2$ or SiNx.

In the nano-scale light emitting structure N, a first conductivity-type nano-core 2204 may be formed by selectively growing a first conductivity-type semiconductor by using the mask layer 2203 having an open area, and an active layer 2205 and a second conductivity-type semiconductor layer 2206 may be formed as shell layers on a surface of the nano core 2204. Accordingly, the nano-scale light emitting structure N may have a core-shell structure in which the first conductivity-type semiconductor is the nano core and the active layer 2205 and the second conductivity-type semiconductor layer 2206 enclosing the nano core are shell layers.

The nano-LED chip 2200 may include a filler material 2207 filling spaces between the nano-scale light emitting structures. The filler material 2207 may structurally stabilize and/or optically improve the nano-scale light emitting structures N. The filler material 2207 may be made of a transparent material (e.g., $SiO_2$), but example embodiments are not limited thereto. An ohmic-contact layer 2208 may be formed on the nano-scale light emitting structures and connected to the second conductivity-type semiconductor layer 2206. The nano-LED chip 2200 may include first and second electrodes 2209a and 2209b connected to the base layer 2202 formed of the first conductivity-type semiconductor and the ohmic-contact layer 2208, respectively.

By forming the nano-light emitting structures N to have different diameters, components, and/or doping densities, light having two or more different wavelengths may be emitted from a single element, e.g., the single lighting unit. By appropriately adjusting light having different wavelengths, white light may be implemented without using phosphors in the single element, and light having various desired colors or white light having different color temperatures may be implemented by combining different LED chips with the foregoing device or combining wavelength conversion materials such as phosphors.

Light Emitting Device

Fourth Example

Figure 13:
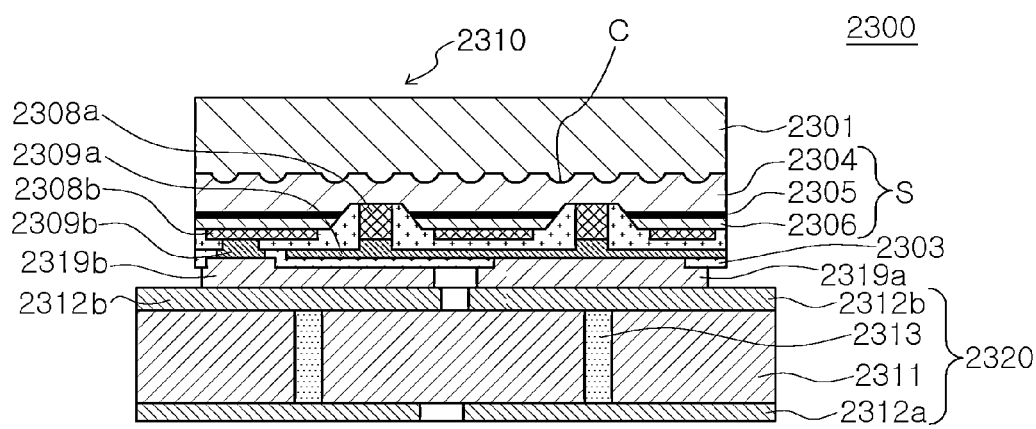
FIG. 13 is a cross-sectional view illustrating an example embodiment of an LED chip as a light emitting device that may be employed in the light source module in FIG. 1.

FIG. 13 illustrates a semiconductor light emitting device 2300 having an LED chip 2310 mounted on a mounting substrate 2320 as a light source. The semiconductor light emitting device 2300 may be employed in the foregoing lighting device.

The semiconductor light emitting device 2300 illustrated in FIG. 13 may include an LED chip 2310 mounted on a mounting substrate 2320. The LED chip 2310 may be an LED chip having a different structure from that of the LED chips described above.

The LED chip 2310 may include a light emitting laminate S disposed in one surface of the substrate 2301 and first and second electrodes 2308a and 2308b disposed on the same surface of the substrate. Also, the LED chip 2310 may include an insulating unit 2303 covering the first and second electrodes 2308a and 2308b.

The first and second electrodes 2308a and 2308b may be connected to first and second electrode pads 2319a and 2319b via electrical connection units 2309a and 2309b, respectively.

The light emitting laminate S may include a first conductivity-type semiconductor layer 2304, an active layer 2305, and a second conductivity-type semiconductor layer 2306 sequentially disposed on the substrate 2301. The first electrode 2308a may be provided as a conductive via connected to the first conductivity-type semiconductor layer 2304 through the second conductivity-type semiconductor layer 2306 and the active layer 2305. The second electrode 2308b may be connected to the second conductivity-type semiconductor layer 2306.

The insulating unit 2303 may have an open area exposing at least portions of the first and second electrodes 2308a and 2308b, and the first and second electrode pads 2319a and 2319b may be connected to the first and second electrodes 2308a and 2308b via the first and second electrical connection units 2309a and 2309b, respectively, through the open area.

The first and second electrodes 2308a and 2308b may be made of a conductive material having ohmic characteristics with respect to the first conductivity-type semiconductor layers 2304 and 2306 and may have a uni-layer or multilayer structure, respectively. For example, the first and second electrodes 2308a and 2408b may be formed by depositing or sputtering one or more of silver (Ag), aluminum (Al), nickel (Ni), chromium (Cr), a transparent conductive oxide (TCO), etc. The first and second electrodes 2308a and 2308b may be disposed in the same direction and may be mounted as a so-called flip-chip on, e.g., a lead frame, as described hereinafter. In this case, the first and second electrodes 2308a and 2308b may be disposed to face in the same direction.

For example, the first electrode 2308a may be connected to the first electrical connection unit 2309a by a conductive via connected to the first conductivity-type semiconductor layer 2304 by passing through the second conductivity-type semiconductor layer 2306 and the active layer 2305 within the light emitting laminate S.

The amount, a shape, a pitch, a contact area of the conductive via and the first electrical connection unit 2309a with respect to the first conductivity-type semiconductor layer 2304 may be appropriately regulated to lower contact resistance. The conductive via and the first electrical connection unit 2309a may be arranged in a row and in a column to improve current flow.

Another electrode structure may include the second electrode 2308b directly formed on the second conductivity-type semiconductor layer 2306 and the second electrical connection portion 2309b formed on the second electrode 2308b. In addition to forming electrical-ohmic connection with the second conductivity-type semiconductor layer 2306, the second electrode 2308b may be made of a light reflective material such that in a state in which the LED chip 2310 is mounted as a so-called flip chip structure, light emitted from the active layer 2305 can be effectively emitted in a direction of the substrate 2301. For example, the second electrode 2308b may be made of a light-transmissive conductive material such as a transparent conductive oxide, according to a main light emitting direction.

The two electrode structures as described above may be electrically separated by the insulating unit 2303. The insulating unit 2303 may be made of any material as long as it has electrically insulating properties. For example, a material having a low degree of light absorption may be used. For example, a silicon oxide or a silicon nitride such as $SiO_2$, $SiO_xN_y$, $Si_xN_y$, or the like, may be used. Further, a light reflective filler may be dispersed within the light-transmissive material to form a light reflective structure.

The first and second electrode pads 2319a and 2319b may be connected to the first and second electrical connection units 2309a and 2309b to serve as external terminals of the LED chip 2310, respectively. For example, the first and second electrode pads 2319a and 2319b may be made of gold (Au), silver (Ag), aluminum (Al), titanium (Ti), tungsten (W), copper (Cu), tin (Sn), nickel (Ni), platinum (Pt), chromium (Cr), NiSn, TiW, AuSn, or a eutectic metal thereof. When the LED chip is mounted on the mounting substrate 2320, the first and second electrode pads 2319a and 2319b may be bonded by using the eutectic metal. Thus, solder bumps generally required in a conventional flip-chip bonding may not be used. Accordingly, the use of a eutectic metal may obtain improved heat dissipation effects in the mounting method in comparison to the case of using solder bumps. In this case, in order to obtain excellent heat dissipation effects, the first and second electrode pads 2319a and 2319b may be formed to occupy a relatively large area.

The substrate 2301 and the light emitting laminate S may be understood with reference to content described above with reference to FIGS. 10 and 11, unless otherwise described. Also, although not shown, a buffer layer may be formed between the light emitting structure S and the substrate 2301. The buffer layer may be employed as an undoped semiconductor layer made of a nitride, or the like, to alleviate lattice defects of the light emitting structure grown thereon.

The substrate 2301 may have first and second main surfaces opposing one another, and an uneven structure (e.g., a depression and protrusion pattern) may be formed on at least one of the first and second main surfaces. The uneven structure formed on one surface of the substrate 2301 may be formed by etching a portion of the substrate 2301 such that the uneven structure is made of the same material as that of the substrate 2301. Alternatively, the uneven structure may be made of a heterogeneous material different from the substrate 2301.

In the present example embodiment, because the uneven structure is formed on the interface between the substrate 2301 and the first conductivity-type semiconductor layer 2304, paths of light emitted from the active layer 1305 can be of diversity, and thus, a light absorption ratio of light absorbed within the semiconductor layer can be reduced and a light scattering ratio can be increased, thereby increasing light extraction efficiency.

In detail, the uneven structure may be formed to have a regular or irregular shape. The heterogeneous material used to form the uneven structure may be a transparent conductor, a transparent insulator, or a material having a relatively high reflectivity. For example, the transparent insulator may be made of a material such as $SiO_2$, $SiN_x$, $Al_2O_3$, $HfO$, $TiO_2$, or $ZrO$. For example, the transparent conductor may be made of a transparent conductive oxide (TCO), e.g., $ZnO$, an indium oxide containing an additive, e.g., Mg, Ag, Zn, Sc, Hf, Zr, Te, Se, Ta, W, Nb, Cu, Si, Ni, Co, Mo, Cr, Sn. For example, the reflective material may include silver (Ag), aluminum (Al), or a distributed Bragg reflector (DBR) including multiple layers having different refractive indices. However, example embodiments are not limited thereto.

The substrate 2301 may be removed from the first conductivity-type semiconductor layer 2304. To remove the substrate 2301, a laser lift-off (LLO) process using a laser, an etching or a polishing process may be used. Also, after the substrate 2301 is removed, depressions and protrusions may be formed on the surface of the first conductivity-type semiconductor layer 1304.

As illustrated in FIG. 13, the LED chip 2310 may be mounted on the mounting substrate 2320. The mounting substrate 2320 includes upper and lower electrode layers 2312b and 2312a formed on upper and lower surfaces of the substrate body 2311, and vias 2313 penetrating through the substrate body 2311 to connect the upper and lower electrode layers 2312b and 2312a. The substrate body 2311 may be made of a resin, a ceramic, or a metal, and the upper electrode layer 2312b or the lower electrode layer 2312a may be a metal layer including, e.g., gold (Au), copper (Cu), silver (Ag), and/or aluminum (Al).

The substrate on which the foregoing LED chip 2310 is mounted is not limited to the configuration of the mounting substrate 2320 illustrated in FIG. 13, and any substrate having a wiring structure for driving the LED chip 2310 may be employed. For example, the substrate described above with reference to FIGS. 3 through 9 may be employed.

Other Examples of Light Emitting Devices

LED chips having various structures other than that of the foregoing LED chip described above may also be used. For example, an LED chip in which surface-plasmon polaritons (SPP) are formed in a metal-dielectric boundary of an LED chip to interact with quantum well excitons, thus obtaining significantly improved light extraction efficiency, may also be used.

The light emitting device 200 may be configured to include at least one of a light emitting device emitting white light by combining green, red, and orange phosphors with a blue LED chip and a purple, blue, green, red, and/or infrared light emitting device. The light emitting device 200 may have a color rendering index (CRI) adjusted to range from 40, which is a level for sodium (Na), to 100, which is a level of a sunlight level, and have a color temperature ranging from 1,500K to 120,000K level to generate various types of white light. Further, the light emitting device 200 may generate visible light having purple, blue, green, red, orange colors, or infrared light to adjust an illumination color according to a surrounding atmosphere or mood. Also, the light source apparatus may generate light having a special wavelength stimulating plant growth.

Figure 14:
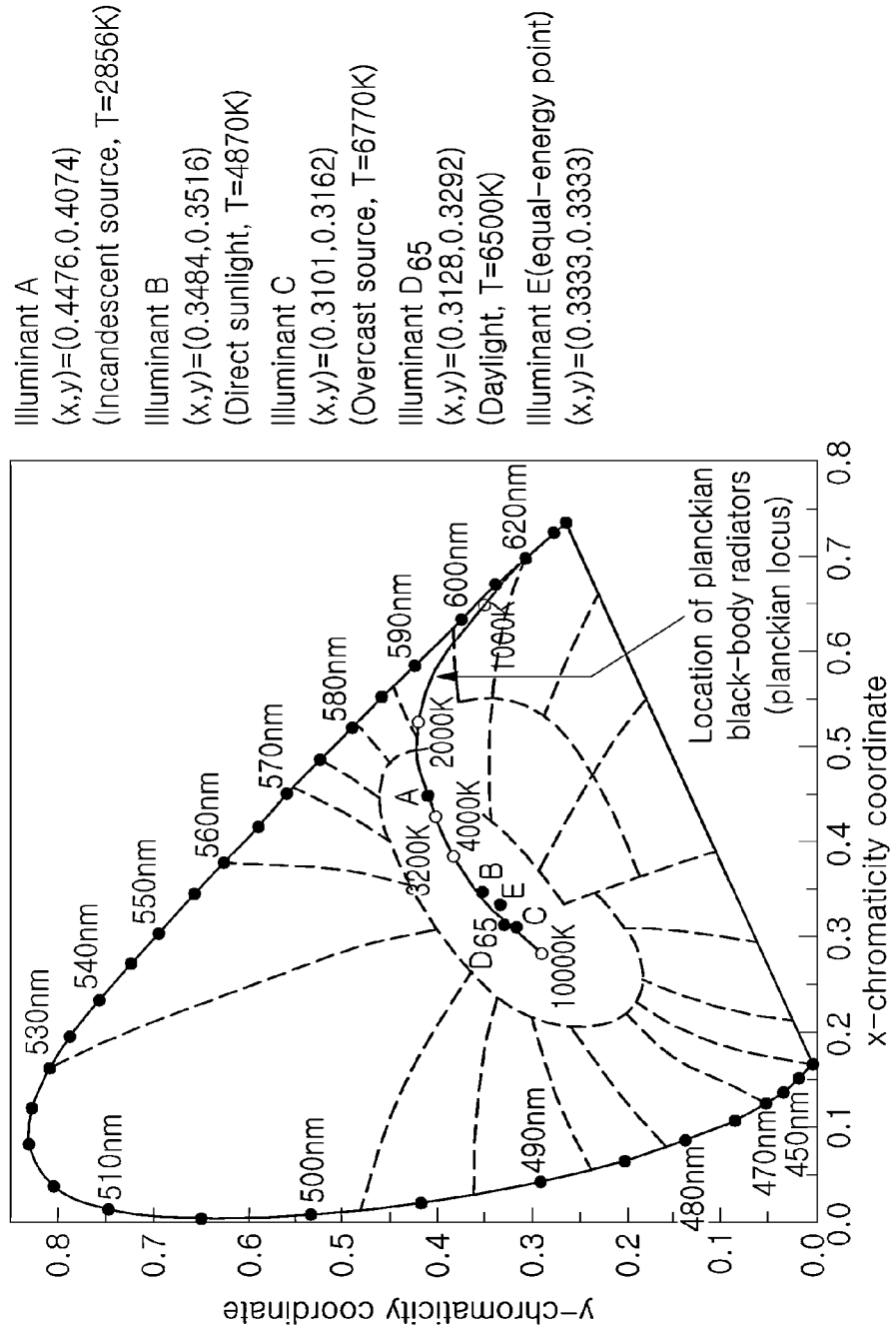
FIG. 14 is CIE 1931 color space chromaticity diagram.

White light generated by combining yellow, green, or red phosphors with a blue LED chip, and/or green and red LED chips may have two or more peak wavelengths and may be positioned at segment linking (x,y) coordinates (0.4476, 0.4074), (0.3484, 0.3516), (0.3101, 0.3162), (0.3128, 0.3292), or (0.3333, 0.3333) of a CIE 1931 chromaticity diagram illustrated in FIG. 14. Alternatively, white light may be positioned in a region surrounded by a spectrum of black body radiation and the segment. A color temperature of white light may correspond to a range from 2,000K to 20,000K.

Phosphors may have the following empirical formula and colors.

Oxide system: Yellow and green $Y_3Al_5O_{12}:Ce$, $Tb_3Al_5O_{12}:Ce$, $Lu_3Al_5O_{12}:Ce$.

Silicate system: Yellow and green $(Ba,Sr)_2SiO_4:Eu$, yellow and orange $(Ba,Sr)_3SiO_5:Ce$.

Nitride system: Green $\beta$-SiAlON:Eu, yellow $L_3Si_6O_{11}:Ce$, orange $\alpha$-SiAlON:Eu, red $CaAlSiN_3:Eu$, $Sr_2Si_5N_8:Eu$, $SrSiAl_4N_7:Eu$.

Phosphor compositions should be basically conformed to Stoichiometry, and respective elements may be substituted with different elements of respective groups of the periodic table. For example, strontium (Sr) may be substituted with barium (Ba), calcium (Ca), magnesium (Mg), or the like, of alkali earths, and yttrium (Y) may be substituted with terbium (Tb), Lutetium (Lu), scandium (Sc), gadolinium (Gd), or the like. Also, europium (Eu), an activator, may be substituted with cerium (Ce), terbium (Tb), praseodymium (Pr), erbium (Er), ytterbium (Yb), or the like, according to a desired energy level, and an activator may be applied alone or a co-activator, or the like, may be additionally applied to change characteristics.

Also, materials such as quantum dots, or the like, may be applied as materials that replace phosphors. Phosphors and quantum dots may be used in combination or alone in an LED.

A quantum dot may have a structure including a core (3 to 10 nm), which includes, e.g., CdSe, InP, a shell (0.5 to 2 nm), which includes, e.g., ZnS, ZnSe, and a ligand for stabilizing the core and the shell, thereby implementing various colors according to sizes.

Table 1 below shows types of phosphors in applications fields of white light emitting devices using a blue LED (440 nm to 460 nm).

TABLE 1

| Purpose | Phosphors |
|---|---|
| LED TV BLU | β-SiAlON:Eu2+ |
|  | (Ca, Sr)AlSiN3:Eu2+ |
|  | L3Si6O11:Ce3+ |
| Lighting | Lu3Al5O12:Ce3+ |
|  | Ca-α-SiAlON:Eu2+ |
|  | L3Si6N11:Ce3+ |
|  | (Ca, Sr)AlSiN3:Eu2+ |
|  | Y3Al5O12:Ce3+ |
| Side View | Lu3Al5O12:Ce3+ |
| (Mobile, Note PC) | Ca-α-SiAlON:Eu2+ |
|  | L3Si6N11:Ce3+ |
|  | (Ca, Sr)AlSiN3:Eu2+ |
|  | Y3Al5O12:Ce3+ |
|  | (Sr, Ba, Ca, Mg)2SiO4:Eu2+ |
| Electrical component | Lu3Al5O12:Ce3+ |
| (Head Lamp, etc.) | Ca-α-SiAlON:Eu2+ |
|  | L3Si6N11:Ce3+ |
|  | (Ca, Sr)AlSiN3:Eu2+ |
|  | Y3Al5O12:Ce3+ |

Phosphors or quantum dots may be applied by using at least one of a method of spraying on a light emitting device, a method of covering as a film, and a method of attaching as a sheet of ceramic phosphor, etc.

The spraying method may including dispensing, spray coating, etc. The dispensing may include a pneumatic method and a mechanical method, e.g., a screw fastening scheme, a linear type fastening scheme, etc. Through a jetting method, an amount of dotting may be controlled through a very small amount of discharging and color coordinates (or chromaticity) may be controlled therethrough. In the case that phosphors are collectively applied on a wafer level or on a mounting board on which an LED is mounted, productivity can be enhanced and a thickness can be easily controlled.

The method of directly covering a light emitting device with phosphors or quantum dots as a film may include electrophoresis, screen printing, or a phosphor molding method, and these methods may be varied according to whether a lateral surface of a chip is to be coated or not.

In order to control efficiency of a long wavelength light emitting phosphor re-absorbing light emitted in a short wavelength, two types of phosphor layer having different light emitting wavelengths may be provided. In order to minimize re-absorption and interference between two or more wavelengths, a DBR (ODR) layer may be included between respective layers. In order to form a uniformly coated film, a phosphor may be fabricated as a film or a ceramic form and attached to a chip or a light emitting device.

In order to differentiate light efficiency and light distribution characteristics, a light conversion material may be positioned in a remote form. For example, the light conversion material may be positioned together with a material such as a light-transmissive polymer, glass, or the like, according to durability and heat resistance.

A phosphor application technique may play an important role in determining light characteristics in an LED device. Thus, techniques of controlling, e.g., a thickness and/or a distribution uniformity of a phosphor application layer have been variously researched.

A quantum dot (QD) may also be positioned in a light emitting device in the same manner as that of a phosphor, and may be positioned in glass or a light-transmissive polymer material to perform optical conversion.

In order to protect a light emitting device from an external environment or in order to improve light extraction efficiency of light emitted to the outside of a light emitting device, a light-transmissive material may be positioned on the light emitting device as a filler. For example, a transparent organic solvent such as epoxy, silicon, a hybrid of epoxy and silicon, or the like, may be applied as a light-transmissive material. The light-transmissive material may be cured according to, e.g., heating, light irradiation, and a time-lapse method In the case of silicon, polydimethyl siloxane is classified as a methyl-based silicon and polymethylphenyl siloxane is classified as a phenyl-based silicon. The methyl-based silicon and the phenyl-based silicon may have differences in refractive indexes, water vapor transmission rates, light transmittance amounts, light fastness qualities, and thermo-stability. Also, the methyl-based silicon and the phenyl-based silicon may have differences in curing speeds according to a cross linker and a catalyst, thereby affecting phosphor distribution.

Light extraction efficiency may vary according to a refractive index of a filler. In order to minimize a gap between a refractive index of the outermost medium of a chip of a portion from which blue light is emitted and a refractive index of a portion emitted by air, two or more types of silicon having different refractive indices may be sequentially laminated.

In general, the methyl-based silicon has a relatively high level of thermo-stability. Accordingly, variations due to a temperature increase may be reduced in order of phenyl-based silicon, hybrid silicon, and epoxy silicon. Silicon may be classified as a gel-type silicon, an elastomer-type silicon, and a resin-type silicon according to the degree of hardness thereof.

The light emitting device may further include an optical element for radially guiding light irradiated from a light source unit. For example, a previously formed optical element may be attached to a light emitting device, or a fluidic organic solvent may be injected into a mold with a light emitting device mounted therein and solidified.

The optical device attachment method includes directly attaching an optical element to a filler, bonding only an upper portion of a chip or an outer portion of a light emitting device or an outer portion of the optical element, bonding to be spaced apart from the filler, etc. As the method of injecting into a mold, injection molding, transfer molding, compression molding, or the like, may be used. Light distribution characteristics may be changed according to shapes of lenses (concave, convex, uneven, conical, or other geometrical structures), and the optical element may be modified according to efficiency and light distribution characteristics.

In the present example embodiment, the light emitting device 200 is illustrated as being a single package unit including an LED chip therein, but example embodiments are not limited thereto. For example, the light emitting device 200 may be an LED chip itself. In this case, the LED chip may be a chip on board (COB) type chip mounted on the substrate 100 and directly electrically connected to the substrate 100 through a flip-chip bonding method or a wire bonding method.

Figure 15:
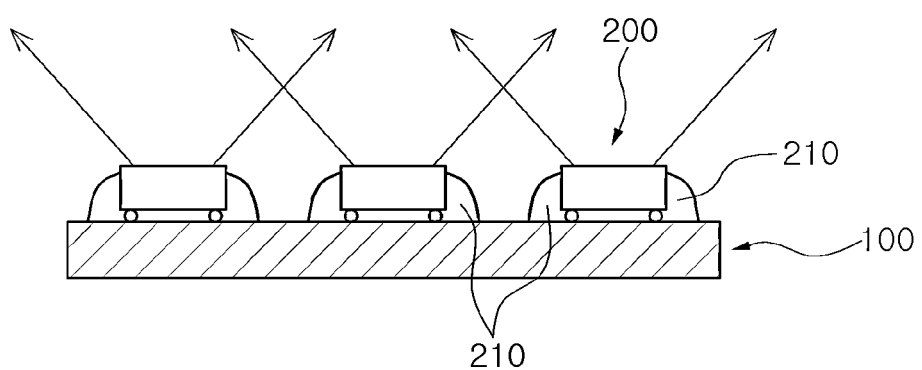
FIG. 15 is a cross-sectional view schematically illustrating a state in which light emitting devices are mounted on a board in FIG. 1.

Also, as illustrated in FIG. 15, a waterproof agent 210 may be formed between the substrate 100 and the light emitting device 200 to surround the ambient regions of the light emitting device 200.

A plurality of light emitting devices 200 may be arranged on the substrate in a length direction. For example, the light emitting devices 200 may be a same type of light emitting devices generating light having the same wavelength or may be various types of light emitting devices generating different wavelengths of light. The plurality of light emitting devices 200 may be spaced apart from one another at desired (or, alternatively predetermined) intervals and arranged in a row.

The plurality of lenses 300 may be mounted on the substrate 100 to cover the plurality of light emitting devices 100. For example, the lenses 300 may be mounted and arranged to be spaced apart from one another on the substrate 100 such that each of the lenses are positioned with respect to a corresponding light emitting devices 200. The respective lenses 300 may be mounted on the substrate 100 such that they are separated from the light emitting devices 200.

As illustrated in FIGS. 2A and 2B, each of the lenses 300 may include a pair of bottom surfaces 310, and an outer surface 320 and an inner surface 330, both of which are connected to the pair of bottom surfaces 310. Each of the lenses 300 may have an overall semi-cylindrical structure. For example, each of the lenses 300 may have a desired (or, alternatively predetermined) length, and may be formed to have the semi-cylindrical shape, by preparing a cylindrical structure with both lateral end portions opened, and cutting in a length direction into two equal parts.

The pair of bottom surfaces 310 may be junction surfaces in contact with the substrate 100 on which the lenses 300 are mounted. The pair of bottom surfaces 310 may have a desired (or, alternatively predetermined) length and be disposed to be parallel to each other. For example, the pair of bottom surfaces 310 may correspond to the cut surfaces of the semi-cylindrical structure.

The outer surface 320 and the inner surface 330, having an arc-shaped curved surface, may connect the pair of bottom surfaces 310. For example, the outer surface 320 and the inner surface 330 may protrude upwardly from one of the pair of bottom surfaces 310, drawing curve, and extend toward the other bottom surface 310.

A pair of facing lateral end portions of the lens 300 may be opened to form a pair of open end portions 340. The pair of open end portions 340 may be perpendicular with respect to the pair of bottom surfaces 310, and thus, as illustrated in FIG. 2(b), when the pair of bottom surfaces 310 of the lenses 300 are installed on the substrate 100, the open end portions 340 may be form a tunnel shape.

Accordingly, in the event that the plurality of lenses 300 are installed on the substrate 100, among a plurality of lateral surfaces, one pair of end portions of the lenses 300 facing one another may be closed, and the other pair of end portions facing one another may be opened. For example, as illustrated in FIG. 2A, among four end portions, one set of two end portions of the lenses 300 facing one another in a width direction of the substrate 100 may be covered by the lenses 300. As illustrated in FIG. 2B, the other set of remaining two end portions in a length direction of the substrate 100, which is perpendicular with respect to the one set of two end portions, may be opened to be exposed outwardly.

The plurality of lenses 300 may be arranged in the length direction of the substrate 100 such that one open end portion 340 of one lens faces one open end portion 340 of another lens adjacent thereto. Thus, the plurality of lenses 300 may have a discontinuous tunnel shape extending in the length direction of the substrate 100

In the present example embodiment, the pair of bottom surfaces 310 of each lens may be defined as lower surfaces of each lens 300, a distance from one open end portion 340 to the other open end portion 340 may be defined as a length of each lens 300, and an 'upper portion' may be generally understood as an upper direction on the basis of the surface on which the lens 300 is mounted. A distance between the outer surface 320 and the inner surface 330 may correspond to a thickness of the lens 300.

Figure 16A:
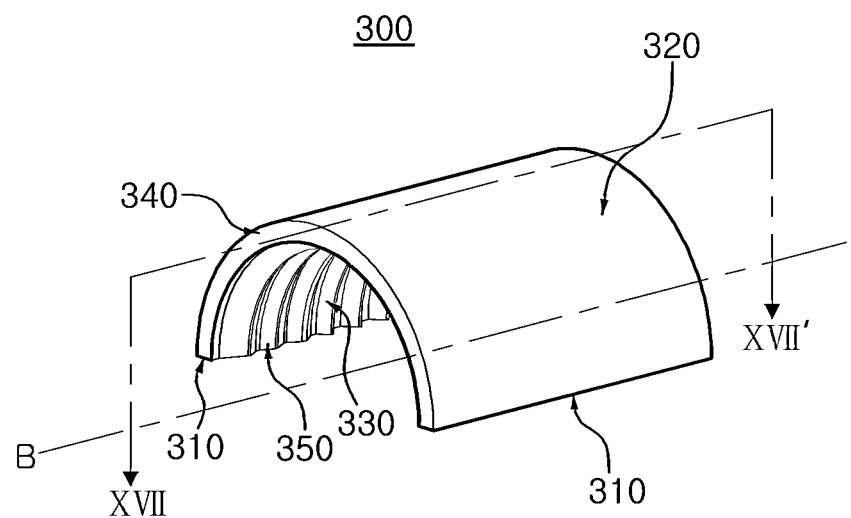
FIGS. 16A and 16B are perspective views schematically illustrating a lens in FIG. 1.
Figure 16B:
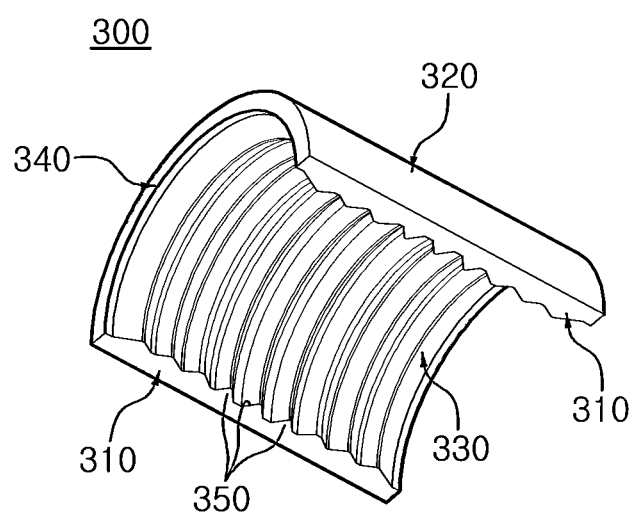

As illustrated in FIGS. 16A and 16B, the lens 300 may include prism patterns 350 formed on the inner surface 330 thereof. The prism patterns 350 may be repeatedly formed along the length direction of the lens 300 from one open end portion 340 of the lens 300 to the other open end portion 340 thereof. The prism patterns 350 may serve to refract light emitted from the light emitting device 200 so that a larger amount of light can be irradiated externally through the open end portions 340 of the lens 300.

The prism patterns 350 may extend along the curved surface of the inner surface 330 from one bottom surface 310 to the other bottom surface 310 and may have a semi-circular shape parallel to the open end portion 340. For example, the prism patterns 350 are rotationally symmetrical in a circumferential direction with respect to a central axis B penetrating through the pair of open end portions 340, and may define a plane perpendicular with respect to a plane defined by the bottom surfaces 310 and the central axis B.

Figure 17:
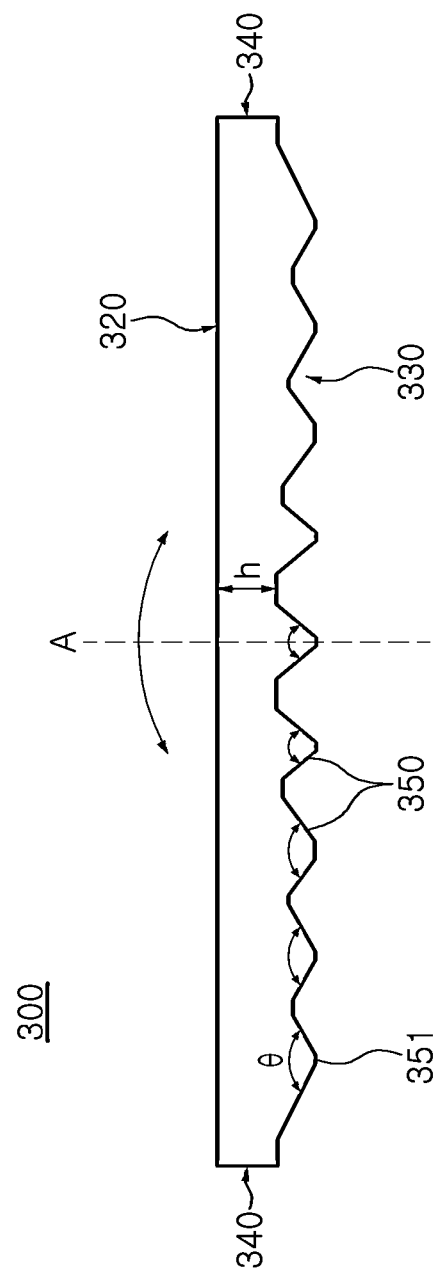
FIG. 17 is a cross-sectional view schematically illustrating the lens taken along line XVII-XVII' in FIG. 16.

FIG. 17 schematically illustrates a cross-section of the lens of FIG. 16 taken along line XVII-XVII'.

As illustrated in FIG. 17, the prism patterns 350 may have a triangular cross-section protruded from the inner surface 330 of the lens 300. A peak 351 of the triangular shape may be protruded toward the substrate 100 when the lens 300 is installed on the substrate 100. In the present example embodiment, the prism patterns 350 are illustrated as having a triangular cross-section with the peak 351, but example embodiments are not limited thereto. For example, the prism patterns 350 may have a trapezoidal shape with a flat peak, e.g., a plateau-shaped peak).

The prism patterns 350 may be symmetrical in a horizontal direction toward both open end portions 340 with respect to the center of the lens 300 in the length direction and may be formed repeatedly. The prism patterns 350 may have a structure in which an angle θ at the peak 351 may increase toward both open end portions 340 from the center of the lens 300 in the length direction.

For example, the angle θ at the peak 351 may be configured considering an angle of incidence of light made incident from a central light source, e.g., the light emitting device 200. The angle θ at the peak may vary according to a position of the peak. For example, the angle θ at the peak may increase the father away from the center of the lens 30. By adjusting a light refraction angle, an irradiation angle may increase such that light outwardly irradiated through the lens 300 widely spreads toward both open end portions 340, rather than being concentrated on the central region of the lens 300, e.g., around an optical axis A.

For example, light emitted from the light emitting device 200 may be refracted from the inner surface 330 of the lens 300, may be made incident to the lens 300, may be refracted again from the outer surface 320, and may be irradiated outwardly. Thus, in order for light to be irradiated more widely toward both open end portions 340 of the lens 300, a direction in which light is refracted from the outer surface 320 may be regulated such that the light is directed toward the both open end portions 340 of the lens 300. The direction in which light is refracted from the outer surface 320 may be determined by an angle of incidence of light to the outer surface 320, and the angle of incidence of light to the outer surface 320 may be determined by a direction in which light is refracted from the inner surface 330. Thus, by regulating angles of the peaks 351 of the prism patterns 350 such that they are different according to the positions of the peaks 351 with respect to the light emitting device 200, the angle of incidence of light to the inner surface 330 may be regulated to meet desired design conditions.

In the present example embodiment, the angles θ at the peaks 351 of the prism patterns 350 may increase as being farther away from the center of the lens 340 toward both open end portions 340 of the lens, but example embodiments are not limited thereto. For example, the angles θ at the peaks 350 of the prism patterns 350 may be equal.

The prism patterns 350 may be configured such that a thickness thereof is increased toward both open end portions 340 of the lens 300 from the center thereof in the length direction. For example, as illustrated in FIG. 17, a thickness h between the outer surface 320 and a valley, at which the two neighboring prism patterns 350 adjoin, may gradually increase toward, e.g., both open end portions 340. Of course, the thickness h may be uniform.

The outer surface 320 of the lens 300 may be subjected to a sanding process, for example, to have a light spreading structure. According to this light spreading structure, light may be more uniformly and widely irradiated outwardly through the lens 300. The light spreading structure may include a fine roughness formed on the outer surface 320.

The lens 300 may be made of a substantially transparent plastic material such that light incident from the light emitting device 200 can be transmitted therethrough and irradiated outwardly. For example, the transparent material may include polycarbonate (PC), polymethylmetacrylate (PMMA), etc. Also, the lens 300 may be made of a glass material, but example embodiments are not limited thereto.

Figure 18A:
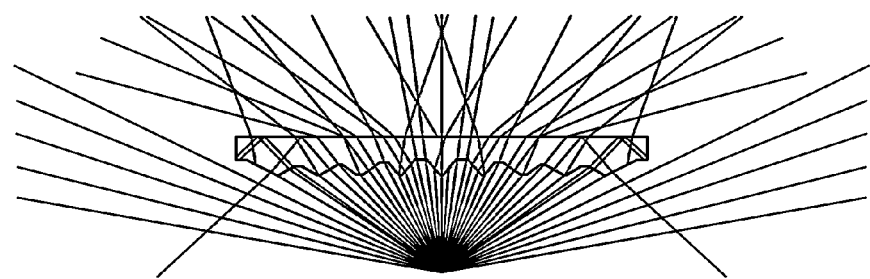
FIG. 18A is a view schematically illustrating paths of light irradiated outwardly through a lens.

FIG. 18A schematically illustrates paths of light irradiated outwardly through a lens. As illustrated, incident light may mostly passes through a central region of a lens so as to be irradiated outwardly in a region adjacent to an optical axis, and a larger amount of light may be refracted in both lateral directions toward the both open end portions so as to be irradiated outwardly at a wider irradiation angle.

Figure 18B:
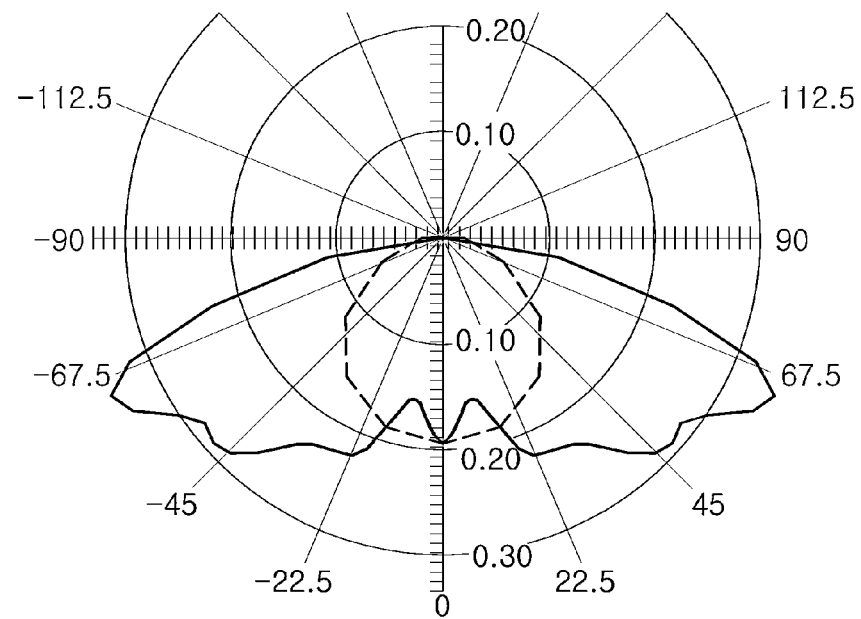
FIG. 18B is a graph schematically showing a light distribution curve.

FIG. 18B schematically illustrates a light distribution curve obtained with a lens and a light distribution curve obtained without a lens. In detail, the dotted line denotes a light distribution curve obtained without a lens, and the solid line denotes a light distribution curve obtained with a lens.

As illustrated, without a lens, a light distribution region may be formed within a range of 45 degrees with respect to an optical axis. In comparison, in a case where the lens according to an example embodiment is provided, light irradiated in both lateral directions, along which open end portions are arranged, with respect to an optical axis may increase. For example, a light distribution region ranging from 45 degrees to 68 degrees may be formed, and an amount of light in the lateral directions, may increase.

Figure 19A:
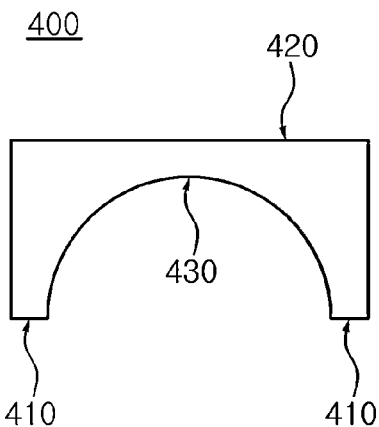
FIGS. 19A through 19C are cross-sectional view schematically illustrating other example embodiments of the lens in FIG. 16.
Figure 19B:
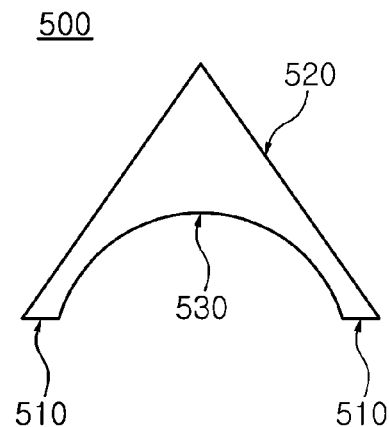
Figure 19C:
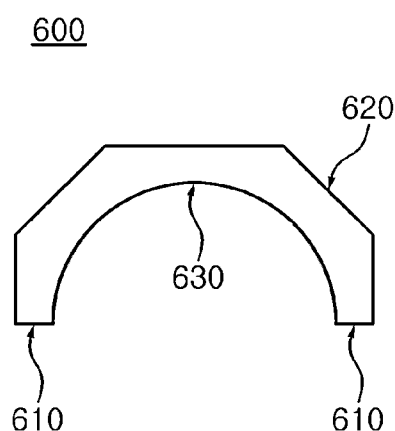

FIGS. 19A through 19C illustrate other example embodiments of a lens. The lenses according to example embodiments illustrated in FIGS. 19A through 19C may have substantially the same basic structure as that of the example embodiment illustrated in FIGS. 1, 2, and 16 through 18, except for the structures of the outer surfaces thereof. Thus, hereinafter, descriptions of the same parts as those of the former example embodiment will be omitted and the different structures of the outer surfaces of the lenses will be largely described.

As illustrated in FIGS. 1, 2, and 16 through 18, the outer surface 320 of the lens 300 may be a curved surface corresponding to the inner surface 330, forming a circular arc. However, the lenses according to example embodiments are not limited to the structure having the curved outer surfaces. For example, as illustrated in FIG. 19A, an outer surface 420 of a lens 400 may have a quadrangular shape, while a bottom surface 410 and an inner surface 430 may have the same shape as those of the former example embodiments. The outer surface 420 of the lens 400 may have a flat upper portion, e.g., a plateau portion.

As illustrated in FIG. 19B, a lens 500 may have an outer surface 520 having a triangular cross-sectional structure. Similarly, a bottom surface 510 and an inner surface 530 of the lens 500 may have the same shape as that of the example embodiments illustrated in FIGS. 1, 2, and 16 through 18. Further, as illustrated in FIG. 19C, a lens 600 may have an outer surface 620 having a pentagonal cross-sectional structure. Besides, lenses may have various other polygonal structures.

FIGS. 20 and 21 illustrate still other example embodiments of the lens. The lenses according to example embodiments illustrated in FIGS. 20 and 21 may have substantially the same structure as that of the example embodiments illustrated in FIGS. 1, 2, and 16 through 18, except for the structures of the outer surfaces thereof. Thus, hereinafter, descriptions of the same parts as those of the former example embodiments will be omitted and the different structures of the outer surfaces of the lenses will be largely described.

As illustrated in FIGS. 1, 2, and 16 through 18, the outer surface 320 of the lens 300 may have a curved surface corresponding to the inner surface 330, forming a circular arc. However, the lenses according to various other example embodiments are not limited to the structure having the curved outer surface.

Figure 20A:
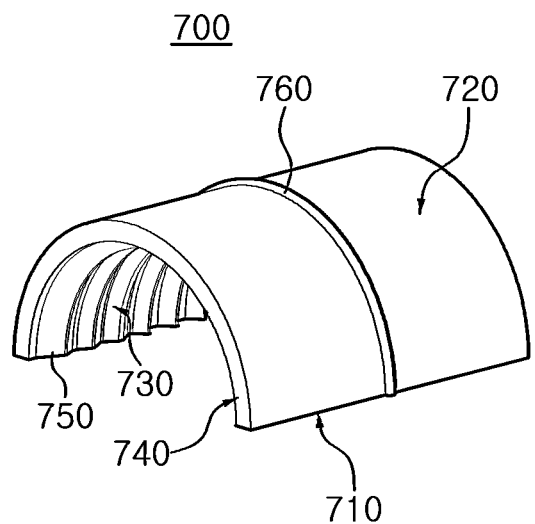
FIGS. 20A through 21B are perspective views and cross-sectional views schematically illustrating still other example embodiments of the lens in FIG. 16.
Figure 20B:
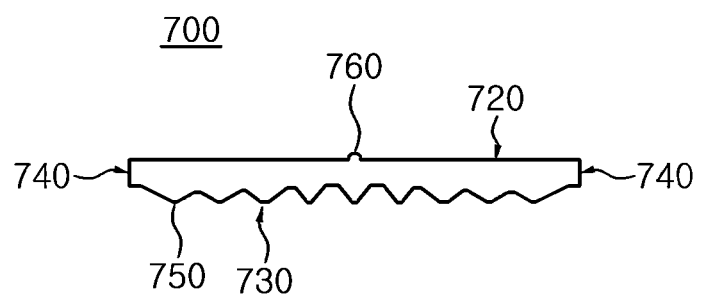

As illustrated in FIGS. 20A and 20B, a protrusion 760 may be formed on an outer surface 720 of a lens 700. Like a prism pattern 750 formed on an inner surface 730 of the lens 700, the protrusion 760 may extend toward both bottom surfaces 710 and may be parallel to both open end portions 740 of the lens 700. With the protrusion 760 formed on the outer surface 720 of the lens 700, irradiation angles of light irradiated outwardly upon being refracted from the outer surface 720 may be variously regulated.

Figure 21A:
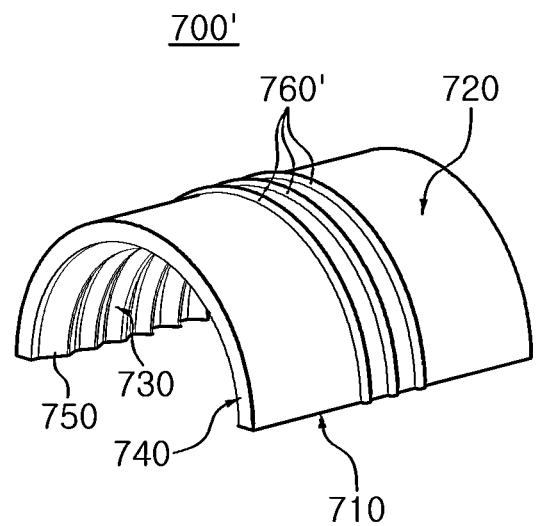
Figure 21B:
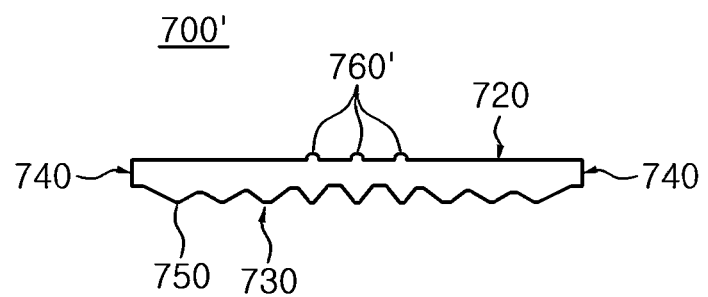

Also, as illustrated in FIGS. 21A and 21B, a plurality of protrusions 760' may be formed on the outer surface 720 of a lens 700'.

According to the present example embodiments, the protrusions 760 and 760' may have a semi-circular cross-sectional shape, but example embodiments are not limited thereto. For example, like the prism pattern 750, the protrusions 760 and 760' may have a triangular cross-sectional shape or various other polygonal cross-sectional shapes.

Figure 22A:
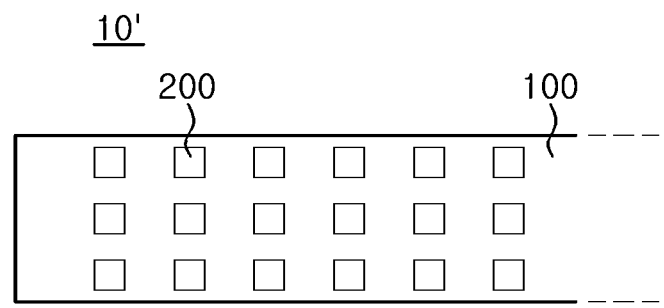
FIGS. 22A and 22B are plan views schematically illustrating a light source module according to other example embodiments.
Figure 22B:
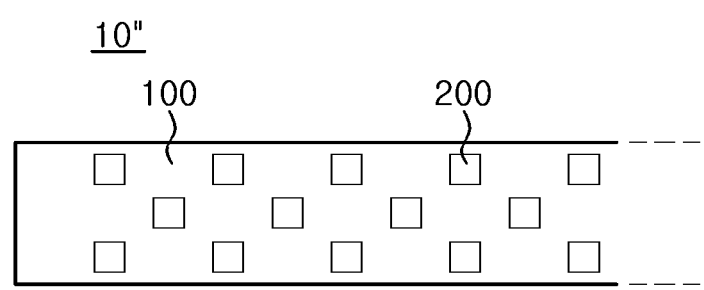

A light source module according to other example embodiments will be described with reference to FIGS. 22A and 22B. FIGS. 22A and 22B are plan views schematically illustrating a light source module according to other example embodiments The configuration of the light source module according to the example embodiments illustrated in FIGS. 22A and 22B may have substantially the same structure as that of the example embodiment illustrated in FIG. 1, except for a layout structure of light emitting devices. Thus, hereinafter, descriptions of the same parts as that of the former example embodiment will be omitted and the layout structure of light emitting devices will be largely described.

As illustrated in FIG. 22A, the plurality of light emitting devices 200 may be arranged to be parallel in a length direction of the substrate 100. For example, the respective light emitting devices 200 may be arranged in rows and columns, having a matrix form. In the present example embodiments, the plurality of light emitting devices 200 may be arranged in the length direction of the substrate 100, forming three rows, but example embodiments are not limited thereto. For example, the light emitting devices may be variously modified. For example, the light emitting devices may be arranged in two rows or four or more rows.

As illustrated in FIG. 22B, the light emitting devices 200 arranged one row may be alternately positioned between the light emitting devices 200 arranged in adjacent rows, thereby forming an zigzag arrangement.

FIGS. 22A and 22B illustrate light source modules 10' and 10" in which lenses 300, 400, 500, 600, 700, and 700' are omitted, to describe the arrangement of the light emitting devices 200. Although the lenses are omitted for the sake of convenience, lenses covering the corresponding light emitting devices may be installed on the substrate and arranged above the light emitting devices as described above such that each of the lenses is positioned with respect to corresponding light emitting devices 200.

Figure 23:
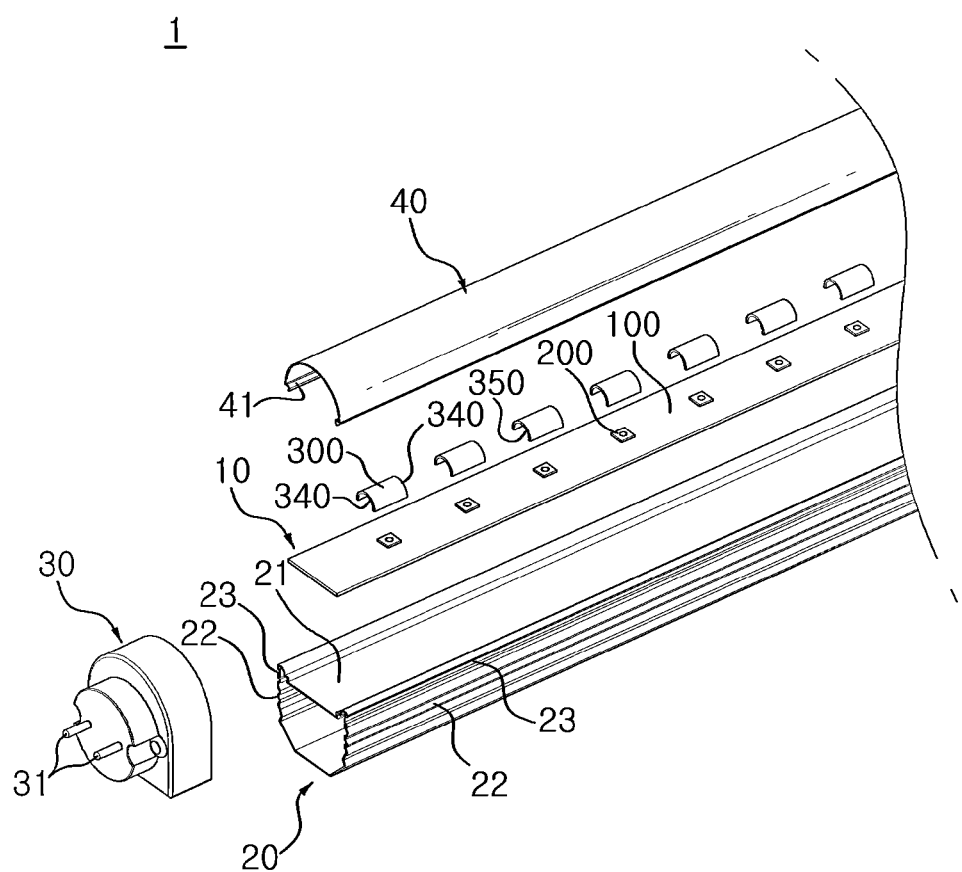
FIG. 23 is an exploded perspective view schematically illustrating a lighting device according to an example embodiment
Figure 24:
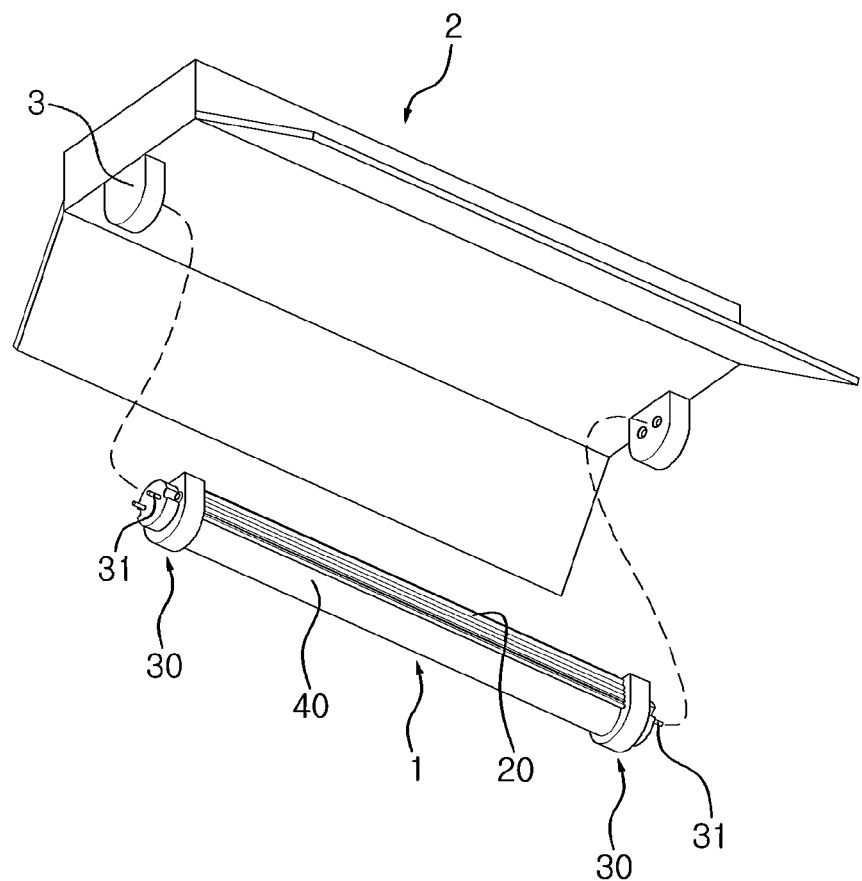
FIG. 24 is a perspective view schematically illustrating a lighting device unit including the lighting device of FIG. 23 installed therein.

Referring to FIGS. 23 and 24, a lighting device and a lighting device unit according to example embodiments will be described.

FIG. 23 is an exploded perspective view schematically illustrating a lighting device according to an example embodiment, and FIG. 24 is a perspective view schematically illustrating a lighting device unit including the lighting device of FIG. 23 installed therein.

As illustrated in FIG. 23, a lighting device 1 according to an example embodiment may include a light source module 10, a body unit 20, and a terminal unit 30. The lighting device 1 may further include a cover unit 40 covering the light source module 10.

The light source module 10 may include a plurality of light emitting devices 200 installed on the substrate 100 and a plurality of lenses 300 installed on the substrate 100 to respectively cover the plurality of light emitting devices 200 having a pair of open end portions 340 facing one another. The plurality of lenses 300 may be arranged on the substrate 100 such that a open end portion 340 of one lens 300 may face an open end portion of another adjacent lens 300.

The lens 300 may have a semi-cylindrical shape in which a pair of open end portion 340 at both ends in the length direction is opened. The lens 300 may further include prism patterns 350 formed on an inner surface thereof. The prism patterns 350 may have a rotationally symmetrical shape in a circumferential direction with respect to a central axis of the lens 300. The prism patterns 350 may be symmetrical in a horizontal direction toward both open end portions 340 with respect to the center of the lens 300 in the length direction and may be formed repeatedly.

The light source module 10 including the lenses 300 may have substantially the same structure as those of the light source modules 10, 10', and 10" illustrated in FIGS. 1, 2, and 16 through 22. Thus, detailed descriptions of the light source module 10 will be omitted.

The light source module 100 may be fastened, coupled, adhered to, and/or attached to one surface of the body unit 20. The body unit 20, a type of a support structure, may include a heat sink. The body unit 20 may be made of a heat-conductive material to dissipate heat generated by the light source module 10 outwardly. For example, the body unit 20 may be made of a metal, but example embodiments are not limited thereto.

The body unit 20 may have an elongated bar-like shape corresponding to the shape of the substrate 100 of the light source module 10. The body unit 20 may have a recess 21 formed on one surface thereof to accommodate the light source module 10 therein.

A plurality of heat dissipating fins 22 for dissipating heat may be protruded from both outer surfaces of the body unit 20. Stopping recesses 23 may be formed on both ends of the outer surface of the body unit 20 in an upper portion of the recess 21 and extend in a length direction of the body unit 20. The cover unit 40 as described hereinafter may be fastened or coupled to the stopping recesses 23.

Both end portions of the body unit 20 may be opened in the length direction, so the body unit 20 may have a pipe structure. In the present example embodiment, the body unit 20 having both opened end portions is illustrated, but example embodiments are not limited thereto. For example, only one of both end portions of the body unit 20 may be opened.

The terminal unit 30 may be provided in at least one of the both opened end portions of the body unit 20 in the length direction to supply power to the light source module 10. In the present example embodiment, because the both end portions of the body unit 20 are opened in the length direction, the terminal unit 30 may be provided in the both end portions of the body unit 20. However, example embodiments are not limited thereto and, when the terminal unit 30 has a structure in which only one end portion of the body unit 20 is opened, the terminal unit 30 may be provided in only one of the both opened end portions of the body unit 20.

The terminal unit 30 may be fastened or coupled to the both opened end portions of the body unit 20 to cover them. The terminal unit 30 may include electrode pins 31 protruded outwardly. As illustrated in FIG. 24, when the lighting device 1 is installed in a lighting device unit 2, the terminal unit 30 may be physically fastened and electrically connected to a socket 3 through the electrode pins 31. The terminal unit 30 may supply power to the light source module 10.

The cover unit 40 may be coupled or fastened to the body unit 20 to cover the light source module 10. The cover unit 40 may be made of a light-transmissive material. For example, the cover unit 40 may be made of substantially the same material as that of the lens 300 of the light source module 10.

The cover unit 40 may have a semi-circular curved surface to outwardly irradiate light therethrough so that the uniformity of the irradiation is improved. The cover unit 40 may have a protrusion 41 formed on a bottom surface to be fastened or coupled to the body unit 20. For example, the protrusion 41 may be formed in a length direction of the cover unit 40 and engaged with the stopping recess 23 of the body unit 20.

In the present example embodiment, the cover unit 40 is illustrated as having a semi-circular shape, but example embodiments are not limited thereto. For example, the cover unit 40 may have a flat quadrangular shape or any other polygonal shapes. The shape of the cover unit 40 may be variously modified according to lighting designs.

Figure 25A:
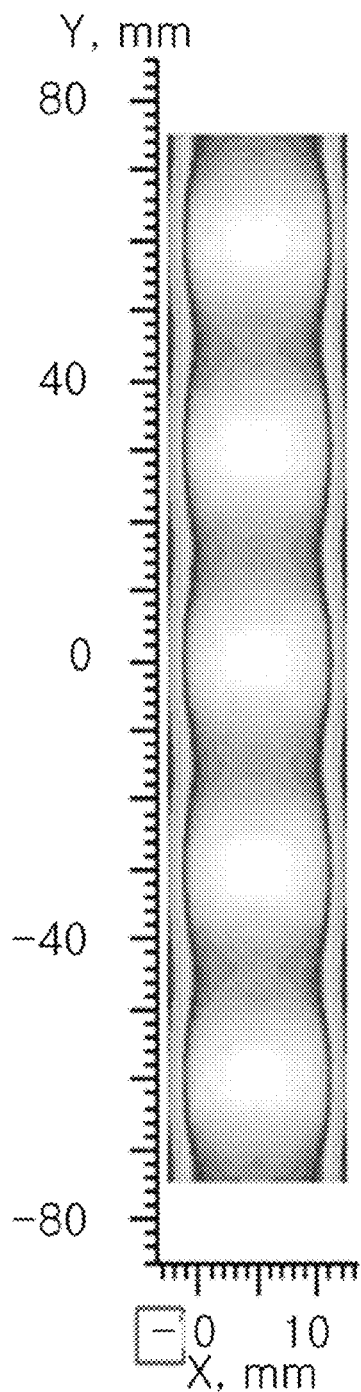
FIGS. 25A and 25B are graphs showing a luminance distribution when a lens according to an example embodiment is not provided and a luminance distribution when the lens is provided, respectively.
Figure 25B:
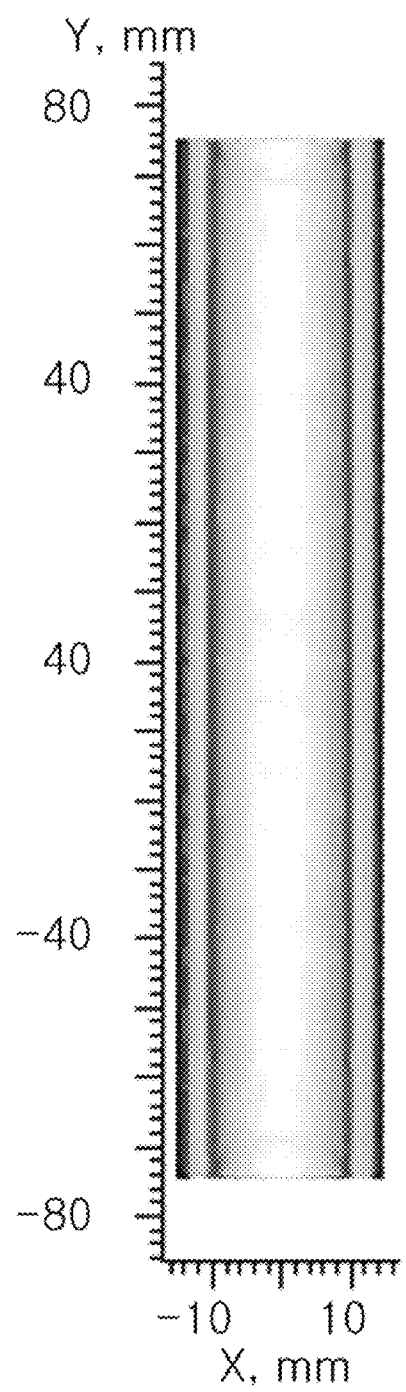

FIGS. 25A and 25B are graphs showing a luminance distribution when a lens according to an example embodiment is not provided and a luminance distribution when the lens is provided, respectively. Forty light emitting devices were used to compare luminance distributions, and spaces (or pitches) between light emitting devices were set to 30 mm.

As illustrated in FIG. 25A, a light source module without lenses covering respective light emitting devices and the lighting device employing the same shows hot spots according to the pitches between the light emitting devices.

In comparison, as illustrated in FIG. 25B, a light source module with lenses covering respective light emitting devices and the lighting device employing the same shows relatively uniform or even luminance overall. For example, even where the pitches between the light emitting devices are relatively wide, because light irradiated outwardly in both lateral directions of the lenses increases, a dark portion between the light emitting devices can be reduced or minimized, thereby resulting in uniform luminance.

A lighting system using the lighting device as described above with reference to FIGS. 26 and 29 will be described. The lighting system according to example embodiments may provide a lighting device having sensitivity (or emotional) illumination capabilities that is able to automatically adjust a color temperature according to a surrounding environment (e.g., temperature and/or humidity conditions) to suit human needs, rather than serving simply as an illumination device.

Figure 26:
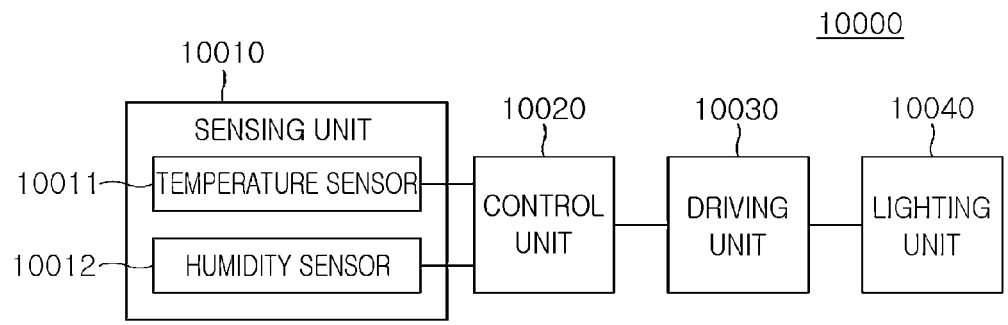
FIG. 26 is a block diagram schematically illustrating a lighting system according to an example embodiment.

FIG. 26 is a block diagram schematically illustrating a lighting system according to an example embodiment.

Referring to FIG. 26, a lighting system 10000 according to an example embodiment may include a sensing unit 10010, a control unit 10020, a driving unit 10030, and a lighting unit 10040.

The sensing unit 10010 may be installed in an indoor or an outdoor area, and may have a temperature sensor 10011 and a humidity sensor 10012 to measure at least one air condition, e.g., at least one temperature and/or humidity of the surrounding air. The sensing unit 10010 may electrically transmits the measured at least one air condition to the control unit 10020.

The control unit 10020 may compare the temperature and/or humidity of the measured air with a desired (or, alternatively preset or predetermined) air condition (e.g., a specific value or a specific range of value of a temperature and/or a humidity). The desired air condition may be previously set by a user. The control unit 10020 may determine a color temperature of the lighting unit 10040 corresponding to the air condition according to the comparison results. The control unit 10020 may be electrically connected to the driving unit 10030, and control the driving unit 10030 to drive the lighting unit 10040.

Figure 27:
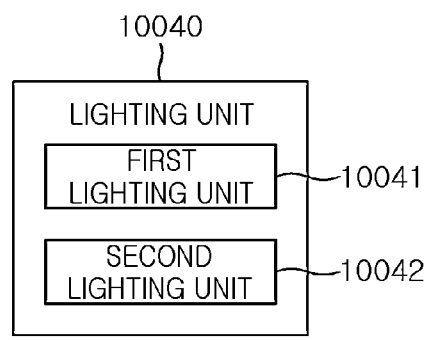
FIG. 27 is a block diagram schematically illustrating a detailed configuration of a lighting unit of the lighting system illustrated in FIG. 26.

The lighting unit 10040 may operate according to power supplied by the driving unit 1003. The lighting unit 10040 may include at least one of the light source module illustrated in FIG. 1 or the lighting device illustrated in FIG. 23. For example, as illustrated in FIG. 27, the lighting unit 10040 may include a first lighting device 10041 and a second lighting device 10042 having different color temperatures, and each of the lighting devices 10041 and 10042 may include a plurality of light emitting devices emitting the same white light.

The first lighting device 10041 may emit white light having a first color temperature, and the second lighting device 10042 may emit white light having a second color temperature. For example, the first color temperature may be lower than the second color temperature. Conversely, the first color temperature may be higher than the second color temperature. For example, white light having a relatively low color temperature may correspond to warm white light, and white light having a relatively high color temperature may correspond to cold white light. When power is supplied to the first and second lighting devices 10041 and 10042, the first and second lighting devices 10041 and 10042 may emit white lights each having a first color temperature and a second color temperature, respectively, and the respective white light beams may be mixed to implement white light having a color temperature determined by the control unit 10020.

In detail, in the case that the first color temperature is lower than the second color temperature, if a color temperature determined by the control unit 10020 is relatively high, a quantity of light of the first lighting device 10041 may be reduced and that of the second lighting device 10042 may be increased to implement mixed white light to have the desired (or, alternatively predetermined) color temperature. Conversely, when the desired (or, alternatively predetermined) color temperature is relatively low, a quantity of the first lighting device 10041 may be increased and that of the second lighting device 10042 may be reduced to implement mixed white light to have the desired (or, alternatively predetermined) color temperature. The quantity of light of the respective lighting devices 10041 and 10042 may be controlled by adjusting a quantity of light of the entire light emitting devices by, e.g., regulating power, or may be controlled by adjusting the number of light emitting devices to be driven.

Figure 28:
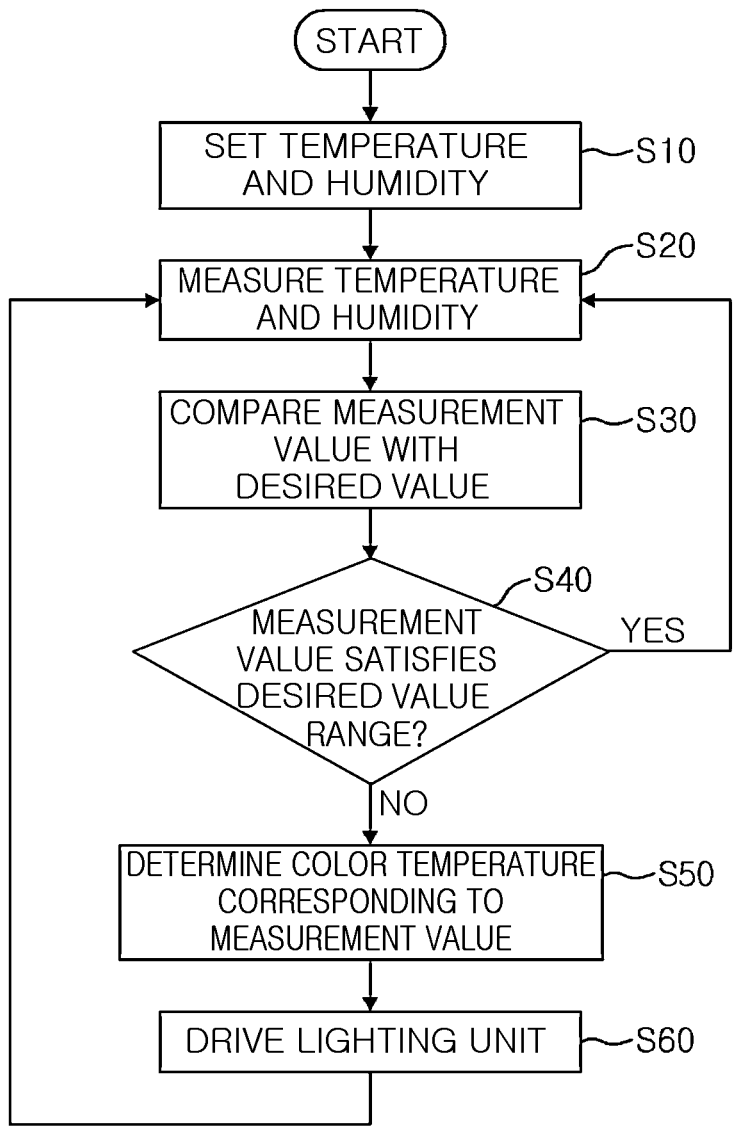
FIG. 28 is a flow chart illustrating a method for controlling the lighting system illustrated in FIG. 26.

FIG. 28 is a flow chart illustrating a method for controlling the lighting system illustrated in FIG. 26. Referring to FIG. 28, first, a user may set a color temperature according to a temperature and/or humidity range through the control unit 10020 (S10). The set temperature and humidity data may be stored in the control unit 10020.

In general, when a color temperature is equal to or more than 6,000K, a color providing a cool feeling, e.g., blue, may be produced, and when a color temperature is less than 4,000K, a color providing a warm feeling, e.g., red, may be produced. Thus, in the present example embodiment, when a temperature and humidity exceed 20° C. and 60%, respectively, the user may set the lighting unit 10040 to be turned on to have a color temperature higher than 6,000K through the control unit 10020, when a temperature and humidity range from 10° C. to 20° C. and 40% to 60%, respectively, the user may set the lighting unit 10040 to be turned on to have a color temperature ranging from 4,000K to 6,000K through the control unit 10020, and when a temperature and humidity are lower than 10° C. and 40%, respectively, the user may set the lighting unit 10040 to be turned on to have a color temperature lower than 4,000K through the control unit 10020.

Next, the sensing unit 10010 measures an air and/or temperature at least one air condition (e.g., a temperature and/or a humidity) of the surrounding air (S20). The temperature and humidity measured by the sensing unit 10010 may be transmitted to the control unit 10020.

Subsequently, the control unit 10020 may compare the measurement values transmitted from the sensing unit 10010 with a desired (or, alternatively pre-set) values (S30). For example, the measurement values may be temperature and humidity data measured by the sensing unit 10010 and the desired (or, alternatively pre-set) values may be temperature and humidity values, for instance, previous set by the user and stored in the control unit 10020. Thus, the control unit 10020 may compare the measured temperature and humidity levels with the desired (or, alternatively pre-set) temperature and humidity levels.

The control unit 10020 may determine whether the measurement values satisfy the desired (or, alternatively pre-set) value ranges (S40). When the measurement values satisfy the desired (or, alternatively pre-set) value ranges, the control unit 10020 may maintain a current color temperature, and may continue to measure temperature and humidity (S20). Conversely, when the measurement values do not satisfy the desired (or, alternatively pre-set) value ranges, the control unit 10020 may determine a corresponding color temperature (S50). Thereafter, the control unit 10020 may control the driving unit 10030 to drive the lighting unit 10040 to have the desired (or, alternatively predetermined) color temperature.

Then, the driving unit 10030 may drive the lighting unit 10040 to have the desired (or, alternatively predetermined) color temperature (S60). Namely, the driving unit 10030 may supply required power to drive the lighting unit 10040 to implement the desired (or, alternatively predetermined) color temperature. Accordingly, the lighting unit 10040 may be adjusted to have a desired (or, alternatively predetermined) color temperature.

Thus, the lighting system according to the example embodiment may automatically regulate a color temperature of the indoor lighting unit according to changes in the surrounding temperature and humidity, thereby providing a relatively comfortable environment in response to changes in the surrounding environment and psychological stability.

FIG. 29 is a view schematically illustrating the use of the lighting system illustrated in FIG. 26. As illustrated in FIG. 29, the lighting unit 10040 may be installed on the ceiling as an indoor lamp. The sensing unit 10010 may be implemented as a separate device and installed on an outer wall to measure outdoor temperature and humidity. The control unit 10020 may be installed in an indoor area to allow the user to easily perform setting and ascertainment operations. However, the lighting system according to example embodiments are not limited this example embodiment, but may be an interior illumination device or a lamp, e.g., a desk lamp that can be used in indoor and outdoor areas.

Another example embodiment of a lighting system using the foregoing lighting device will be described with reference to FIGS. 30 through 33. The lighting system according to this example embodiment may detect a motion of a monitored target and/or an intensity of illumination at a location of the monitored target and automatically perform the desired (or, alternatively predetermined) control.

FIG. 30 is a block diagram of a lighting system according to another example embodiment.

Referring to FIG. 30, a lighting system 10000' may include a wireless sensing module 10100 and a wireless lighting controlling apparatus 10200.

The wireless sensing module 10100 may include a motion sensor 10110, an illumination intensity sensor 10120 sensing an intensity of illumination, and a first wireless communications unit generating a wireless signal. The wireless signal may include a motion sensing signal from the motion sensor 10110 and/or an illumination intensity sensing signal from the illumination intensity sensor 10120 and comply with a desired (or, alternatively predetermined) communications protocol. The first wireless communications unit may transmit the wireless signal. For example, the first wireless communications unit may be configured as a first ZigBee communications unit 10130 generating a ZigBee signal.

The wireless lighting controlling apparatus 10200 may include a second wireless communications unit receiving the wireless signal from the first wireless communications unit and restoring a sensing signal, a sensing signal analyzing unit 10220 analyzing the sensing signal from the second wireless communications unit, and an operation control unit 10230 performing a desired (or, alternatively predetermined) control based on analysis results from the sensing signal analyzing unit 10220. The second wireless communications unit may be configured as a second ZigBee communications unit 10210 receiving the ZigBee signal from the first ZigBee communications unit and restoring the sensing signal.

FIG. 31 is a view illustrating a format of a ZigBee signal according to an example embodiment.

Referring to FIG. 31, the ZigBee signal from the first ZigBee communications unit 10130 may include channel information (CH) defining a communications channel, a wireless network identification (ID) information (PAN_ID) defining a wireless network, a device address (Ded_Add) designating a target device, and sensing data including motion and/or illumination intensity values.

Also, the ZigBee signal from the second ZigBee communications unit 10210 may include channel information (CH) defining a communications channel, a wireless network identification (ID) information (PAN_ID) defining a wireless network, a device address (Ded_Add) designating a target device, and sensing data including motion and/or illumination intensity values.

The sensing signal analyzing unit 10220 may analyze the sensing signal from the second ZigBee communications unit 10210 to determine whether desired (or, alternatively pre-set) condition(s), among a plurality of conditions, are satisfied based on the sensed motion and/or the sensed intensity of illumination.

For example, the operation control unit 10230 may be configured to perform a plurality of controls based on a plurality of conditions that are desirable or alternatively previously set by the sensing signal analyzing unit 10220, and perform specific control(s) corresponding to the condition(s) detected by the sensing signal analyzing unit 10220.

Figure 32:
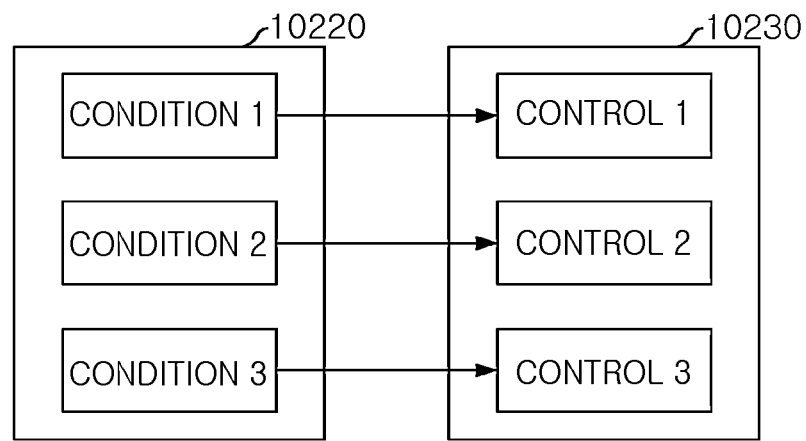
FIG. 32 is a view illustrating a sensing signal analyzing unit and an operation control unit according to an example embodiment.

FIG. 32 is a view illustrating the sensing signal analyzing unit and the operation control unit according to an example embodiment. Referring to FIG. 32, for example, the sensing signal analyzing unit 10220 may analyze the sensing signal from the second ZigBee communications unit 10210 and analyze whether the sensed motion and/or intensity of illumination values satisfy some of the desired (or, alternatively pre-set) first, second, and third conditions (e.g., condition 1, condition 2, and condition 3).

In this case, the operation control unit 10230 may be configured to perform first, second and third controls (e.g., control 1, control 2, and control 3) corresponding to the first, second, and third conditions (e.g., condition 1, condition 2, and condition 3), which are desirable or alternatively previously set by the sensing signal analyzing unit 10220, and perform a control corresponding to the condition detected by the sensing signal analyzing unit 10220.

Figure 33:
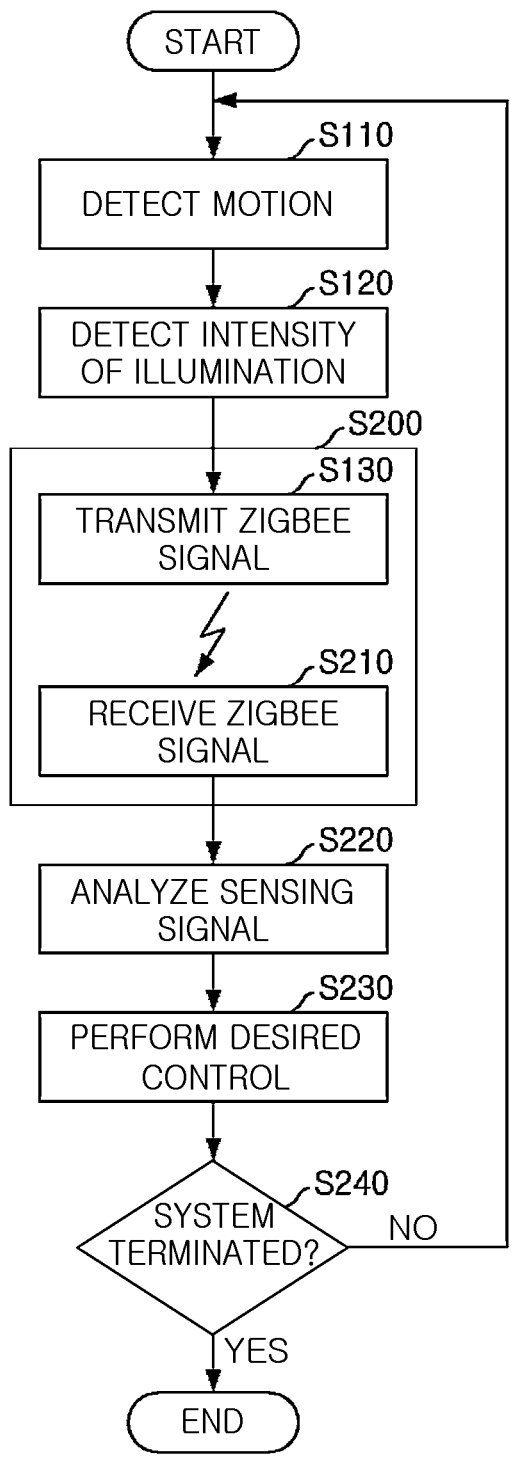
FIG. 33 is a flow chart illustrating an operation of a wireless lighting system according to an example embodiment.

FIG. 33 is a flow chart illustrating an operation of a wireless lighting system according to an example embodiment.

Referring to FIG. 33, the motion sensor 10110 may detect a motion (s110). The illumination intensity sensor 10120 may detect an intensity of illumination (s120). Operation S200 may be a process of transmitting and receiving a ZigBee signal. Operation S200 may include operation S130 of transmitting a ZigBee signal by the first ZigBee communications unit 10130 and operation S210 of receiving the ZigBee signal by the second ZigBee communications unit 10210. In operation S220, the sensing signal analyzing unit 10220 may analyze a sensing signal. In operation S230, the operation control unit 10230 may perform a desired (or, alternatively predetermined) control. In operation S240, whether the lighting system is terminated may be determined.

Operations of the wireless sensing module and the wireless lighting controlling apparatus according to an embodiment will be described with reference to FIGS. 30 through 33.

First, the wireless sensing module 10100 of the wireless lighting system according to an example embodiment will be described with reference to FIGS. 30, 31, and 33. The wireless lighting system 10100 according to an example embodiment may be installed in a location, to detect a current intensity of illumination of the current lighting device and detect human motion near the lighting device.

The motion sensor 10110 of the wireless sensing module 10100 may be configured as, for instance, an infrared sensor, which is capable of sensing a human. The motion sensor 10100 may sense a motion and provides the same to the first ZigBee communications unit 10130 (S110 in FIG. 33). The illumination intensity sensor 10120 of the wireless sensing module 10100 may sense an intensity of illumination and provide the same to the first ZigBee communications unit 10130 (S120).

Accordingly, the first ZigBee communications unit 10130 may generate a ZigBee signal that includes the motion sensing signal from the motion sensor 10100 and/or the illumination intensity sensing signal from the illumination intensity sensor 10120, and transmit the generated ZigBee signal wirelessly (S130). The Zigbee signal may comply with a desired (or, alternatively pre-set) communications protocol.

The wireless lighting controlling apparatus 10200 of the wireless lighting system according to an example embodiment will be described with reference to FIGS. 30, 31, 32, and 33. The wireless lighting controlling apparatus 10200 of the wireless lighting system may control a desired (or, alternatively predetermined) operation according to the illumination intensity value and/or a motion value included in the ZigBee signal from the wireless sensing module 10100.

The second ZigBee communications unit 10210 of the wireless lighting controlling apparatus 10200 may receive the ZigBee signal from the first ZigBee communications unit 10130, restore a sensing signal therefrom, and provide the restored sensing signal to the sensing signal analyzing unit 10200 (S210 in FIG. 33).

Referring to FIG. 31, the ZigBee signal from the second ZigBee communications unit 10210 may include channel information (CH) defining a communications channel, a wireless network identification (ID) information (PAN_ID) defining a wireless network, a device address (Ded_Add) designating a target device, and the sensing data. A wireless network may be identified based on the channel information (CH) and the wireless network ID information (PAN_ID), and a sensed device may be recognized based on the device address. The sensing signal may include the motion value and/or the illumination intensity value.

Also, referring to FIG. 30, the sensing signal analyzing unit 10220 may analyze the illumination intensity value and/or the motion value included in the sensing signal from the second ZigBee communications unit 10210 and provide the analysis results to the operation control unit 10230 (S220 in FIG. 33).

Accordingly, the operation control unit 10230 may perform a desired (or, alternatively predetermined) control according to the analysis results from the sensing signal analyzing unit 10220 (S230).

The sensing signal analyzing unit 10220 may analyze the sensing signal form the second ZigBee communications unit 10210 and determine whether desired (or, alternatively pre-set) condition(s), among a plurality of conditions, are satisfied based on the sensed motion and/or the sensed intensity of illumination. For example, the operation control unit 10230 may be configured to perform a plurality of controls corresponding to the plurality of conditions that are desirable or alternatively set in advance by the sensing signal analyzing unit 10220, and perform specific control(s) corresponding to the condition(s) detected by the sensing signal analyzing unit 10220.

For example, referring to FIG. 32, the sensing signal analyzing unit 10220 may analyze whether the sensed motion and/or intensity of illumination values satisfy some of the desired (or, alternatively pre-set) first, second, and third conditions (e.g., condition 1, condition 2, and condition 3) with respect to the sensed human motion and/or the sensed intensity of illumination by analyzing the sensing signal from the second ZigBee communications unit 10210.

In this case, the operation control unit 10230 may be configured to perform first, second, and third controls (e.g., control 1, control 2, and control 3) corresponding to the first, second, and third conditions (e.g., condition 1, condition 2, and condition 3), which are desirable or alternatively set in advance by the sensing signal analyzing unit 10220, and perform a control corresponding to the condition detected by the sensing signal analyzing unit 10220.

For example, when the first condition (condition 1) corresponds to a case in which human motion is sensed at a front door and an intensity of illumination at the front door is not low (not dark), the first control may turn off all desired (or, alternatively predetermined) lamps. When the second condition (condition 2) corresponds to a case in which human motion is sensed at the front door and an intensity of illumination at the front door is low (dim), the second control may turn on some desired (or, alternatively pre-set) lamps (e.g., some lamps at the front door and some lamps in a living room). When the third condition (condition 3) corresponds to a case in which human motion is sensed at the door stop and an intensity of illumination at the front door is very low (very dark), the third control may turn on all the desired (or, alternatively pre-set) lamps.

Unlike the foregoing cases, the first, second, and third controls may be variously applied according to desired (or, alternatively pre-set) operations. For example, the first, second, and third controls may be associated with operations of a lamp and an air-conditioner in summer or may be associated with operations of a lamp and heating in winter.

Another example of a lighting system using the foregoing lighting device will be described with reference to FIGS. 34 through 37.

Figure 34:
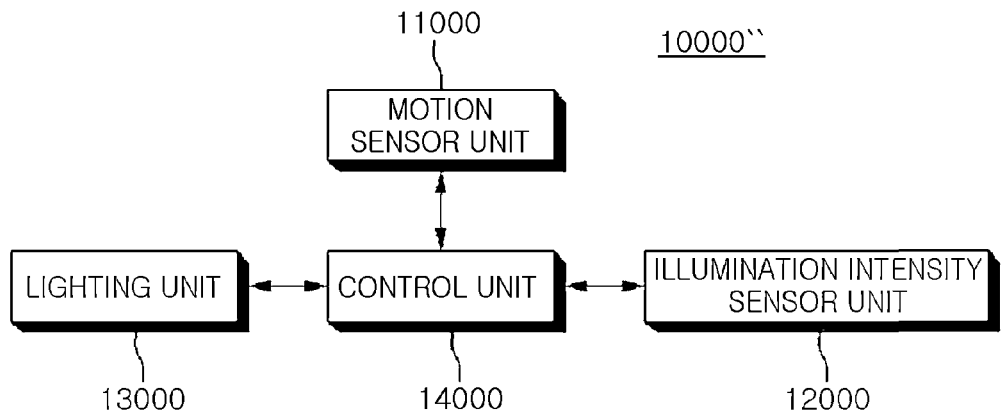
FIG. 34 is a block diagram schematically illustrating components of a lighting system according to another example embodiment.

FIG. 34 is a block diagram schematically illustrating constituent elements of a lighting system according to another example embodiment. A lighting system 10000" according to the present example embodiment may include a motion sensor unit 11000, an illumination intensity sensor unit 12000, a lighting unit 13000, and a control unit 14000.

The motion sensor unit 11000 may sense a motion of an object. For example, the lighting system may be attached to a movable object, for example, a container or a vehicle, and the motion sensor unit 11000 may sense a motion of the object that moves. When the motion of the object to which the lighting system is attached is sensed, the motion sensor unit 11000 may output a signal to the control unit 14000 and the lighting system may be activated. The motion sensor unit 11000 may include, for instance, an accelerometer, a geomagnetic sensor, etc.

The illumination intensity sensor unit 12000, a type of optical sensor, may measure an intensity of illumination of the surrounding environment. When the motion sensor unit 11000 senses the motion of the object to which the lighting system is attached, the illumination intensity sensor unit 12000 may be activated in response to a signal output from the control unit 14000. The lighting system may illuminate during night work or in a dark environment to call a worker or an operator's attention to the surrounding environment, and provide a driver with a desired visibility at night. Thus, even when the motion of the object to which the lighting system is attached is sensed, if an intensity of illumination higher than a desired (or, alternatively predetermined) level is secured (during the day), the lighting system may not illuminate. Also, even in the daytime, if it rains, the intensity of illumination may be fairly low, there may be a need to inform a worker or an operator about a movement of a container. Accordingly, the lighting unit may emit light. Thus, whether to turn on the lighting unit 13000 may be determined according to an illumination intensity value measured by the illumination intensity sensor unit 12000.

The illumination intensity sensor unit 12000 may measure an intensity of illumination of the surrounding environment and output the measurement value to the control unit 14000 as described hereinafter. When the illumination intensity value is equal to or higher than a desired (or, alternatively, pre-set) value, the lighting unit 13000 may not emit light, and thus the overall system may terminate its operation.

When the illumination intensity value measured by the illumination intensity sensor unit 12000 is lower than the desired (or, alternatively pre-set) value, the lighting unit 13000 may emit light. The worker or the operator may recognize the light emissions from the lighting unit 1300 and recognize, for instance, a movement of a container. As the lighting unit 13000, the foregoing lighting device may be employed.

Also, the lighting unit 13000 may adjust intensity of light emissions thereof according to the illumination intensity value of the surrounding environment. When the illumination intensity value of the surrounding environment is low, the lighting unit 13000 may increase the intensity of light emissions thereof. When the illumination intensity value of the surrounding environment is relatively high, the lighting unit 13000 may decrease the intensity of light emissions thereof, thus preventing or reducing waste of power.

The control unit 14000 may control at least one of the motion sensor unit 1100, the illumination intensity sensor unit 12000, and the lighting unit 13000. When the motion sensor unit 11000 senses a motion of an object to which the lighting system is attached, and outputs a signal to the control unit 14000, the control unit 14000 may output an operation signal to the illumination intensity sensor unit 12000. The control unit 14000 may receive an illumination intensity value measured by the illumination intensity sensor unit 12000 and determine whether to turn on (operate) the lighting unit 13000.

Figure 35:
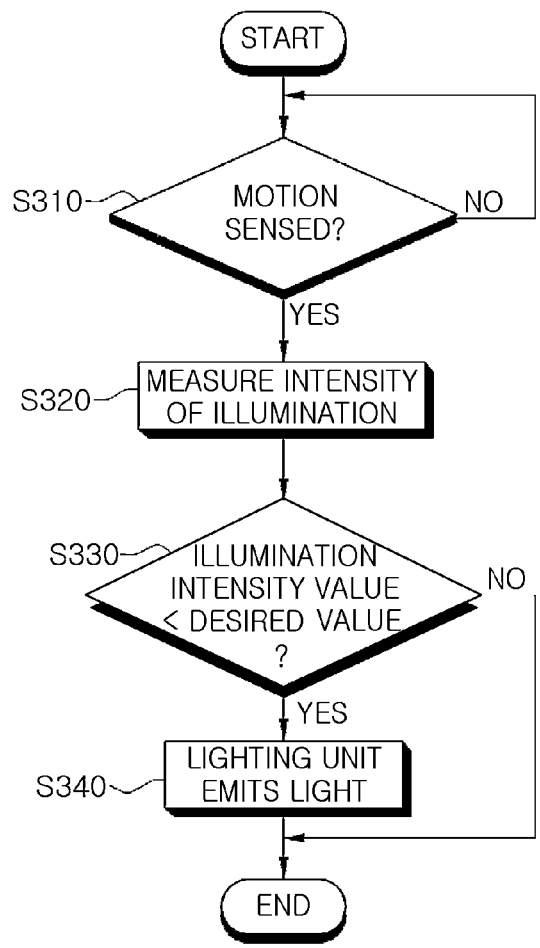
FIG. 35 is a flow chart illustrating a method for controlling a lighting system.

FIG. 35 is a flow chart illustrating a method for controlling a lighting system. Hereinafter, a method for controlling a lighting system will be described with reference to FIG. 35.

First, a motion of an object to which the lighting system is attached may be sensed and an operation signal may be output (S310). For example, the motion sensor unit 11000 may sense a motion of a container or a vehicle in which the lighting system is installed, and when a motion of the container or the vehicle is sensed, the motion sensor unit 11000 may output an operation signal. The operation signal may be a signal for activating overall power. For example, when a motion of a container or a vehicle is sensed, the motion sensor unit 11000 may output an operation signal to the control unit 14000.

Next, based on the operation signal, an intensity of illumination of the surrounding environment is measured and an illumination intensity value may be output (S320). When the operation signal is applied to the control unit 14000, the control unit 14000 may output a signal to the illumination intensity sensor unit 12000, and then the illumination intensity sensor unit 12000 may measure an intensity of illumination of the surrounding environment. The illumination intensity sensor unit 12000 may output the measured illumination intensity value of the surrounding environment to the control unit 14000. Thereafter, whether to turn on the lighting unit may be determined according to the illumination intensity value and the lighting unit may emit light according to the determination.

The illumination intensity value may be compared with a desired (or, alternatively pre-set) value for the determination. When the illumination intensity value is input to the control unit 14000, the control unit 14000 may compare the received illumination intensity value with a desired or a stored pre-set value and may determine whether the former is lower than the latter. For example, the desired or pre-set value may be a value to determine whether to turn on or off the lighting device. For example, the desired or pre-set value may be an illumination intensity value at which a worker or a driver may have difficulty in recognizing an object with the naked eye or may be prone to make a mistake in the situation, for example, a situation in which the sun starts to set.

When the illumination intensity value measured by the illumination intensity sensor unit 12000 is higher than the desired (or, alternatively pre-set) value, lighting of the lighting unit may not be required, so the control unit 14000 may shut down the overall system.

Meanwhile, when the illumination intensity value measured by the illumination intensity sensor unit 12000 is higher than the desired (or, alternatively pre-set) value, lighting of the lighting unit may be required so the control unit 14000 may output a signal to the lighting unit 13000 and the lighting unit 13000 may emit light (S340).

Figure 36:
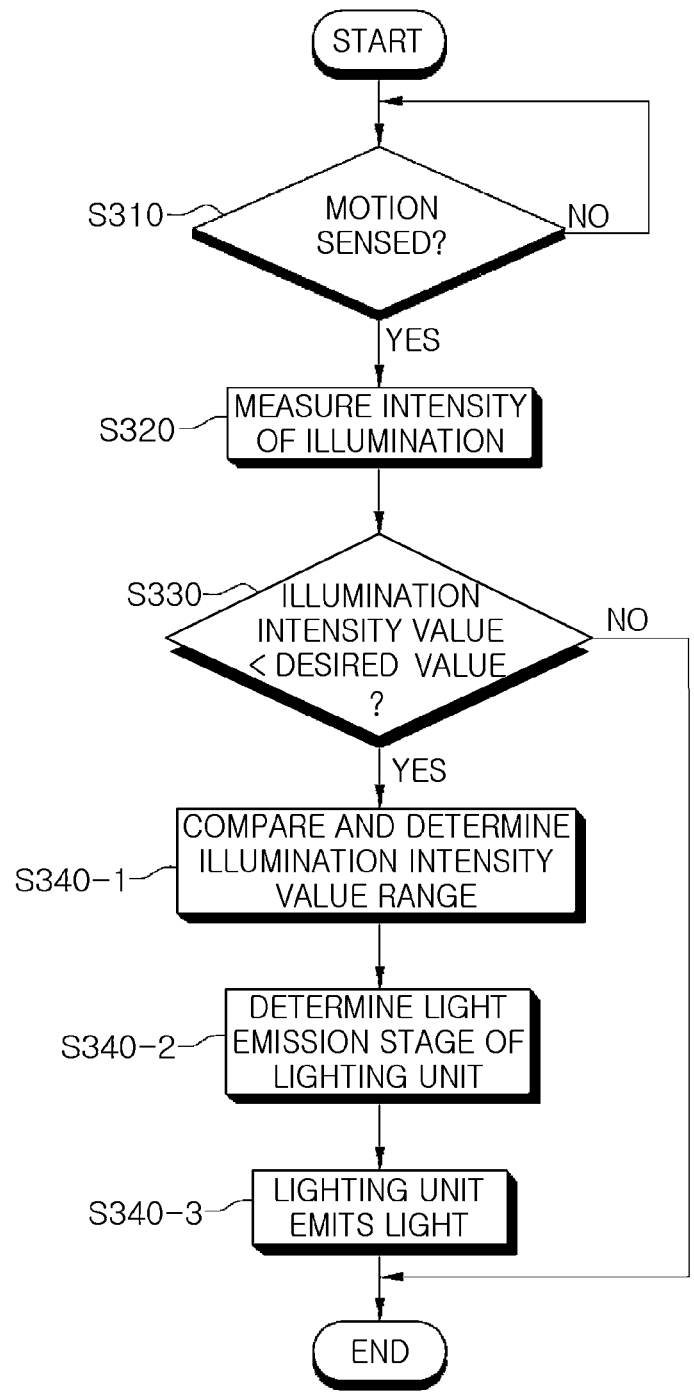
FIG. 36 is a flow chart illustrating a method for controlling a lighting system according to another example embodiment.

FIG. 36 is a flow chart illustrating a method for controlling a lighting system according to another example embodiment. Hereinafter, a method for controlling a lighting system according to another example embodiment will be described. However, the same procedure as that of the method for controlling a lighting system as described above with reference to FIG. 35 will be omitted.

As illustrated in FIG. 36, in the case of the method for controlling a lighting system according to the present example embodiment, an intensity of light emissions of the lighting unit may be regulated according to an illumination intensity value of a surrounding environment.

As described above, the illumination intensity sensor unit 12000 may output an illumination intensity value to the control unit 14000 (S320). When the illumination intensity value is lower than a desired (or, alternatively pre-set) value (S330), the control unit 14000 may determine a range of the illumination intensity value (S340-1). The control unit 14000 may have a range of subdivided illumination intensity value, based on which the control unit 14000 may determine the range of the measured illumination intensity value.

Next, when the range of the illumination intensity value is determined, the control unit 14000 may determine an intensity of light emissions of the lighting unit (S340-2). Accordingly, the lighting unit 13000 may emit light (S340-3). The intensity of light emissions of the lighting unit may be divided according to the illumination intensity value. For example, the illumination intensity value may vary according to, e.g., weather, time, and surrounding environment so the intensity of light emissions of the lighting unit may also be regulated. By regulating the intensity of light emissions according to the range of the illumination intensity value, waste of power may be prevented or reduced and a worker or an operator's attention may be drawn to their surroundings.

Figure 37:
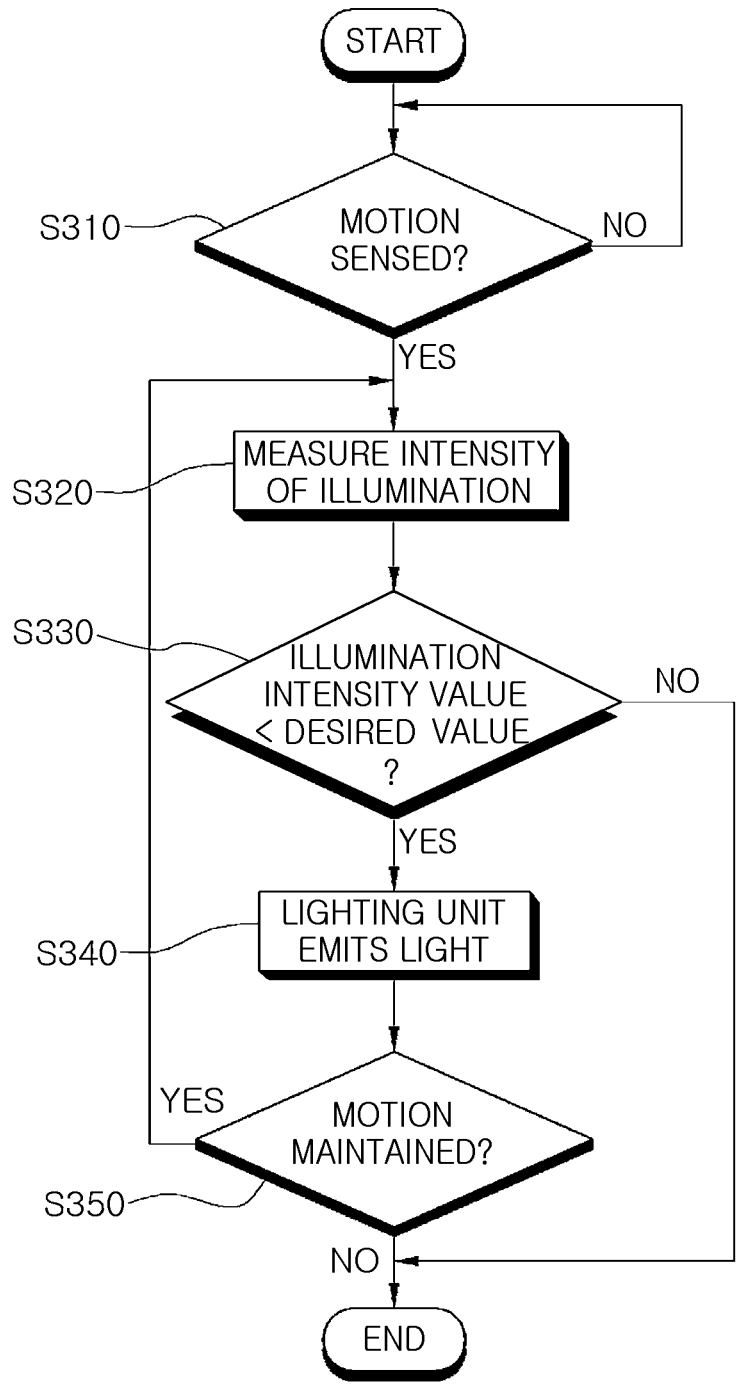
FIG. 37 is a flow chart illustrating a method for controlling a lighting system according to another example embodiment.

FIG. 37 is a flow chart illustrating a method for controlling a lighting system according to another example embodiment. Hereinafter, a method for controlling a lighting system according to another example embodiment will be described. However, the same procedure as that of the method for controlling a lighting system as described above with reference to FIGS. 35 and 36 will be omitted.

The method for controlling a lighting system according to the present example embodiment may further include operation S350 of determining whether a motion of an object to which the lighting system is attached is maintained in a state in which the lighting unit 13000 emits light, and determining whether to maintain light emissions.

When the lighting unit 13000 starts to emit light, termination of the light emissions may be determined based on whether a container or a vehicle to which the lighting system is installed moves. For example, when a motion of the container stops, the lighting unit 13000 may terminate its operation. Further, when a vehicle temporarily stops at a crosswalk, light emissions of the lighting unit may stop to prevent or reduce interference with the vision of oncoming drivers.

When the container or the vehicle moves again, the motion sensor unit 11000 may resume its operation and the lighting unit 14000 may start to emit light.

Whether to maintain light emissions may be determined based on whether a motion of an object to which the lighting system is attached is sensed by the motion sensor unit 11000. When a motion of the object continuously sensed by the motion sensor unit 11000, an intensity of illumination may be continuously measured and whether to maintain light emissions may be continuously re-determined. When a motion of the object is not sensed, the lighting unit 13000 may terminate its operation.

As set forth above, the light source module and the lighting device including the same according to example embodiments may need lesser number of LEDs light sources can be reduced, thereby lowering cost. Further, although the number of the LEDs to be employed is reduced, the generation of hot spots may be minimized or avoid, thereby maintaining substantial luminance uniformity of the lighting device.

Advantages and effects of example embodiments are not limited to the foregoing content and any other technical effects not mentioned herein may be easily understood by a person skilled in the art from the foregoing description.

While example embodiments have been shown and described in connection with the specific example embodiments, it will be apparent to those skilled in the art that modifications and variations can be made without departing from the spirit and scope of example embodiments as defined by the appended claims.

What is claimed is:

1. A light source module comprising:
    a substrate;
    a plurality of light emitting devices on the substrate; and
    a plurality of lenses on the substrate to cover the plurality of light emitting devices, respectively, each of the plurality of lenses having a pair of open end portions facing one another, the plurality of lenses arranged such that an open end portion of one lens faces an open end portion of an adjacent lens, at least one of the lenses including,
        a pair of bottom surfaces disposed parallel to one another while in contact with the substrate,
        an inner surface and an outer surface protruded upwardly from the substrate and the pair of bottom surfaces, the inner surface having prism patterns, the prism patterns having peaks protruding from the inner surface, angles at peaks of the prism patterns increasing from a center of the at least one lens towards both lateral surfaces of the at least one lens, and
        a light spreading structure at the outer surface and extending towards the pair of bottom surfaces.

2. The light source module of claim 1, wherein for each of the lenses the pair of open end portions are perpendicular with respect to the pair of bottom surfaces.

3. The light source module of claim 2, wherein,
    the prism patterns are repeated patterns in a length direction of the at least one lens between the pair of open end portions.

4. The light source module of claim 1, wherein
    the substrate includes a first metal layer, an insulating layer on the first metal layer, and a second metal layer on the insulating layer, and
    the substrate has a step portion at at least one end portion thereof, the step portion exposing the insulating layer.

5. The light source module of claim 1, the light emitting device comprising:
    a light emitting laminate including a first conductivity-type semiconductor layer, an active layer, and a second conductivity-type semiconductor layer; and
    first and second electrodes connected to the first conductivity-type semiconductor layer and the second conductivity-type semiconductor layer, respectively, the first electrode including at least one conductive via, the at least one conductive via passing through the second conductivity-type semiconductor layer and the active layer and connected to the first conductivity-type semiconductor layer.

6. The light source module of claim 1, the light emitting device comprising:
    a plurality of nano-light emitting structures, each of the plurality of nano-light emitting structures including a nano-core as a first conductivity-type semiconductor, an active layer, and a second conductivity-type semiconductor layer enclosing the nano-core as shell layers; and a filler material filling spaces between the plurality nano-light emitting structures, wherein the active layer and the second conductivity-type semiconductor layer cover sidewalls and a top surface of the nano-core.

7. The light source module of claim 1, wherein
the light emitting device is configured to emit white light through a combination of green, red, and orange phosphors in conjunction with a blue LED chip, and
the light emitting device is configured to emit the white light with a color rendering index (CRI) adjusted to range between about 40 and about 100.

8. The light source module of claim 1, wherein
the light emitting device is configured to emit white light through a combination of yellow, green, red phosphors in conjunction with a blue LED chip, is configured to position the white light at least one of segment linking (x,y) coordinates (0.4476, 0.4074), (0.3484, 0.3516), (0.3101, 0.3162), (0.3128, 0.3292), (0.3333, 0.3333) of a CIE 1931 chromaticity diagram and in a region surrounded by a spectrum of black body radiation and the segment, and is configured to emit the white light with a color temperature ranging from about 2,000K to about 20,000K.

9. The light source module of claim 1, further comprising:
a waterproof agent layer between the substrate and the light emitting device, the waterproof agent surrounding the ambient regions of the light emitting device.

10. A lighting device comprising:
a light source module including,
    a substrate,
    a plurality of light emitting devices on the substrate, and
    a plurality of lenses on the substrate to cover the plurality of light emitting devices, respectively, each of the plurality of lenses having a pair of open end portions facing one another, the plurality of lenses arranged such that an open end portion of one lens faces an open end portion of an adjacent lens, at least one of the lenses including,
        a pair of bottom surfaces disposed parallel to one another while in contact with the substrate,
        an inner surface and an outer surface protruded upwardly from the substrate and the pair of bottom surfaces, the inner surface having prism patterns, the prism patterns having peaks protruding from the inner surface, angles at peaks of the prism patterns increasing from a center of the at least one lens towards both lateral surfaces of the at least one lens, and
        a light spreading structure at the outer surface and extending towards the pair of bottom surfaces;
a body unit configured to be coupled to the light source module; and
a terminal unit at at least one of two open end portions of the body unit and configured to supply power to the light source module.

11. The lighting device of claim 10, wherein the at least one lens has a semi-cylindrical shape with both ends opened, and a length direction of each lens being a direction defined by the pair of open end portions of each lens.

12. The lighting device of claim 11, wherein
each of the prism patterns is symmetrical in a circumferential direction with respect to a central axis through the pair of open end portions, and the prism patterns are arranged in the length direction to be symmetric with respect to the center of the at least one lens in the length direction.

13. The lighting device of claim 10, further comprising:
a cover unit configured to couple with the body unit to cover the light source module.

14. A lighting system comprising:
a lighting unit being the lighting device of claim 10;
a sensing unit configured to measure atmospheric conditions;
a control unit configured to compare the measured atmospheric conditions with an atmospheric condition, and configured to determine a color temperature of the lighting unit; and
a driving unit configured to drive the lighting unit according to the determined color temperature.

15. A light source module comprising:
a substrate;
a light emitting device on the substrate; and
a first lens on the light emitting device, the first lens covering the light emitting device in a first direction and exposing the light emitting device in a second direction, the first lens including,
    a pair of bottom surfaces disposed parallel to one another while in contact with the substrate,
    an inner surface and an outer surface protruded upwardly from the substrate and the pair of bottom surfaces, the inner surface having prism patterns, the prism patterns having peaks protruding from the inner surface, angles at peaks of the prism patterns increasing from a center of the first lens towards both lateral surfaces of the first lens, and
    a light spreading structure at an outer surface of each of the lens extending towards the pair of bottom surfaces.

16. The light source module of claim 15, wherein the first and second directions are perpendicular to each other.

17. The light source module of claim 15, wherein the first lens has a first pair of open end portions, the first pair of open end portions disposed in the second direction and facing each other.

18. The light source module of claim 17, further comprising:
a second lens neighboring the first lens, one of the first pair of open end portions of the first lens facing one of a second pair of open end portions of the second lens.

19. The light source module of claim 15, wherein the light spreading structure has one of a semi-circular cross-sectional shape or a polygonal cross-sectional shape.

* * * * *